(12) United States Patent
Huber et al.

(10) Patent No.: US 7,926,176 B2
(45) Date of Patent: Apr. 19, 2011

(54) METHODS FOR MAGNETICALLY DIRECTED SELF ASSEMBLY

(75) Inventors: William Hullinger Huber, Scotia, NY (US); Ching-Yeu Wei, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 1582 days.

(21) Appl. No.: 11/254,181

(22) Filed: Oct. 19, 2005

(65) Prior Publication Data

US 2007/0087472 A1  Apr. 19, 2007

(51) Int. Cl.
*B21D 51/16* (2006.01)
*B23P 17/00* (2006.01)

(52) U.S. Cl. ..... 29/890.09; 29/602.1; 29/832; 29/890.1; 438/106

(58) Field of Classification Search ............ 29/602.1, 29/832, 890.01, 890.09; 438/106
See application file for complete search history.

(56) References Cited

U.S. PATENT DOCUMENTS

| | | | |
|---|---|---|---|
| 3,439,416 A | 2/1966 | Yando | |
| 4,834,805 A | 5/1989 | Erbert | |
| 5,203,847 A | 4/1993 | Butt | |
| 5,474,060 A | 12/1995 | Evans | |
| 5,574,605 A | 11/1996 | Baumgart et al. | |
| 5,783,856 A | 7/1998 | Smith et al. | |
| 5,932,097 A | 8/1999 | Wilson | |
| 6,080,337 A | 6/2000 | Kambe et al. | |
| 6,303,218 B1 | 10/2001 | Kamiguchi et al. | |
| 6,328,856 B1 | 12/2001 | Brucker | |
| 6,331,364 B1 | 12/2001 | Baglin et al. | |
| 6,337,215 B1 | 1/2002 | Wilson | |
| 6,507,989 B1 | 1/2003 | Bowden et al. | |
| 6,555,252 B2 | 4/2003 | Sellmyer et al. | |
| 6,657,289 B1 | 12/2003 | Craig et al. | |
| 6,702,186 B1 | 3/2004 | Hamann et al. | |
| 6,744,583 B2 | 6/2004 | Ikeda et al. | |
| 6,749,955 B2 | 6/2004 | Krino et al. | |

(Continued)

FOREIGN PATENT DOCUMENTS

JP  6-85301  3/1994

(Continued)

OTHER PUBLICATIONS

M. Boncheva et al., "Magnetic self-assembly of three-dimensional surfaces from planar sheets," Department of Chemistry and Chemical biology, Harvard University, www.pnas.org, vol. 102, No. 11, Mar. 15, 2005, pp. 3924-3929.

(Continued)

*Primary Examiner* — Paul D Kim
(74) *Attorney, Agent, or Firm* — Penny A. Clarke

(57) ABSTRACT

A fluidic assembly method includes dispersing a number of functional blocks in a fluid to form a slurry. Each of the functional blocks includes at least one element and a patterned magnetic film comprising at least one region. The fluidic assembly method further includes immersing at least a portion of an article in the fluid. The article includes a substrate, a number of receptor sites disposed on the substrate and a number of magnetic receptors, each of the magnetic receptors being disposed within a respective one of the receptor sites. A method of manufacturing an assembly includes disposing a number of functional blocks over at least a portion of an article, agitating the functional blocks relative to the article and assembling at least a subset of the functional blocks to the magnetic receptors on the article.

45 Claims, 22 Drawing Sheets

U.S. PATENT DOCUMENTS

| | | | |
|---|---|---|---|
| 6,780,696 | B1 | 8/2004 | Schatz |
| 6,816,330 | B2 | 11/2004 | Ikeda et al. |
| 6,881,497 | B2 | 4/2005 | Coffey et al. |
| 7,132,222 | B2 | 11/2006 | Chappert et al. |
| 7,217,592 | B2 | 5/2007 | Nuggehalli et al. |
| 7,218,465 | B1 | 5/2007 | Deeman et al. |
| 7,218,466 | B1 | 5/2007 | Deeman et al. |
| 2003/0040129 | A1 | 2/2003 | Shah |
| 2004/0016998 | A1 | 1/2004 | Fonstad et al. |
| 2005/0201176 | A1 | 9/2005 | Zangari et al. |
| 2005/0266271 | A1 | 12/2005 | Tsuchiya et al. |
| 2006/0051517 | A1* | 3/2006 | Haas et al. ............ 427/457 |
| 2006/0108442 | A1* | 5/2006 | Russell et al. ............ 239/102.1 |
| 2007/0056621 | A1 | 3/2007 | Baskaran |
| 2007/0084501 | A1 | 4/2007 | Kalberlah et al. |
| 2007/0236213 | A1 | 10/2007 | Paden et al. |
| 2008/0135956 | A1 | 6/2008 | Huber et al. |
| 2009/0056513 | A1 | 3/2009 | Baer |
| 2009/0159125 | A1 | 6/2009 | Prather et al. |

FOREIGN PATENT DOCUMENTS

| | | |
|---|---|---|
| JP | 6085301 | 3/1994 |

OTHER PUBLICATIONS

B. B. Yellen et al., " Arranging matter by magnetic nanoparticle assemblers," Dept. of Mechanical Engineering and Materials Science, Duke University, www.pnas.org, vol. 102, No. 25, Jun. 21, 2005, pp. 8860-8864.

B. B. Yellen et al., "Programmable Assembly of Heterogeneous Colloidal Particle Arrays," Advanced Materials, Jan. 16, 2004, vol. 16, No. 2, pp. 111-115.

Hsi-Jen J. Yeh et al., "Fluidic Self-Assembly for the Integration of GaAs Light-Emitting Diodes on Si Substrates," IEEE Photonics Technology letters, vol. 6, No. 6, Jun. 1994, pp. 706-708.

W. Zheng et al., "Shape-and-solder-directed self-assembly to package semiconductor device segments," Applied Physics letters, vol. 85, No. 16, Oct. 18, 2004, pp. 3635-3637.

U. Srinivasan et al., "Microstructure to Substrate Self-Assembly Using Capillary Forces," Journal of Microelectromechanical Systems, vol. 10, No. 1, Mar. 2001, pp. 17-24.

H. O. Jacobs et al., "Fabrication of a Cylindrical Display by Patterened Assembly," www.sciencemag.org, vol. 296, Apr. 12, 2002, pp. 323-325.

J. Linemann et al., "Modeling, Simulation, and Experimentation of a Promising New Packaging Technology: parallel fluidic Self-Assembly of Microdevices," Albert Ludwig University, Freiburg Germany, Abstract, 2003.

U.S. Appl. No. 11/254,096 Office Action, May 6, 2010.
U.S. Appl. No. 11/254,094 Office Action, Aug. 9, 2010.
JP06-085301 Abstract, Mar. 25, 1994.
Notice of References Cited, Huber et al., U.S. Appl. No. 11/254,094, 1 Page.
U.S. Appl. No. 11/254,096, Office Action dated May 6, 2009.
U.S. Appl. No. 11/254,094, Office Action dated Dec. 30, 2009.
U.S. Appl. No. 11/254,094, Office Action dated Apr. 16, 2009.
U.S. Appl. No. 11/254,096, Office Action dated Nov. 3, 2009.
Office Action, U.S. Appl. No. 11/637,668, Apr. 16, 2010.
Office Action, U.S. Appl. No. 12/014,356, Aug. 27, 2009.
Office Action, U.S. Appl. No. 12/014,356, Mar. 17, 2010.
M. Anhalt et al., "Magnetic properties of polymer bonded soft magnetic particles for various filler fractions," Journal of Applied Physics, vol. 101, 2007, pp. 023907-1-023907-8.
CPEL0853686, Patent Application No. 200910003480.6, Mar. 9, 2010.
JP 06-085301 Abstact, Mar. 25, 1994.
SPS Technologies, Arnold Magnetic Group Products, Catalogue Technical Notes, TN 0205, Dec. 2002, pp. 1-6
W. H. Huber et al., U.S. Appl. No. 12/014,356, Office Action Sep. 3, 2010.
W.H. Huber et al., U.S. Appl. No. 11/254,096, Office Action Sep. 10, 2010.

* cited by examiner

METHODS FOR MAGNETICALLY DIRECTED SELF ASSEMBLY

STATEMENT REGARDING FEDERALLY SPONSORED RESEARCH & DEVELOPMENT

This invention was made with Government support under contract number W911CX04C0099 awarded by the Defense Advanced Research Agency for the Department of Defense. The Government has certain rights in the invention.

CROSS REFERENCE TO RELATED APPLICATIONS

This application is related to commonly assigned, concurrently filed U.S. patent application to W. H. Huber et al., entitled "Functional blocks for assembly and method of manufacture," which application is incorporated by reference herein in its entirety. This application is also related to commonly assigned, concurrently filed U.S. patent application to W. H. Huber et al., entitled "Article and assembly for magnetically directed self assembly," which application is also incorporated by reference herein in its entirety.

BACKGROUND

The invention relates generally to the assembly of components onto a surface, and more particularly, to the assembly of building blocks onto a substrate for electronic circuit fabrication, sensors, energy conversion, photonics and other applications.

There is a concerted effort to develop large area, high performance electronics for applications such as medical imaging, nondestructive testing, industrial inspection, security, displays, lighting and photovoltaics, among others. Two approaches are typically employed. For systems involving large numbers of active elements (for example, transistors) clustered at a relatively small number of locations, a "pick and place" technique is typically employed, for which the active elements are fabricated, for example using single crystal semiconductor wafers, and singulated (separated) into relatively large components (for example, on the order of 5 mm) comprising multiple active elements. The components are sequentially placed on a printed circuit board (PCB). Typically, the components are sequentially positioned on the PCB using robotics. Because the pick and place approach can leverage high performance active elements, it is suitable for fabricating high performance electronics.

A key limitation of the pick and place approach is that the components must be serially placed on the PCB. Therefore, as the number of components to be assembled increases, the manufacturing cost increases to the point where costs become prohibitive. In addition, as the component size decreases, it becomes increasingly difficult to manipulate and position the components using robotics. Accordingly, this technique is ill-suited for the manufacture of low density, distributed electronics, such as flat panel displays or digital x-ray detectors. Instead, a wide-area, thin film transistor (TFT) based approach is typically employed to manufacture low density, distributed electronics. Typically, the TFTs comprise amorphous silicon (a-Si) TFTs fabricated on large glass substrates. Although a-Si TFTs have been successfully fabricated over large areas (e.g. liquid crystal displays), the transistor performance is relatively low and therefore limited to simple switches. In addition, with this process, the unit cost of a large area electronic circuit necessarily scales with the size of the circuit.

Another approach is to substitute a higher mobility semiconducting material, such as polysilicon, cadmium selenide (CdSe), cadmium sulfide (CdS) or germanium (Ge), for a-Si to form higher mobility TFTs. While TFTs formed using these higher mobility materials have been shown to be useful for small-scale circuits, their transistor characteristics are inferior to single crystal transistors, and thus circuits made from these materials are inherently inferior to their single crystal counterparts. As with a-Si, the unit cost of a large area electronic circuit necessarily scales with the size of the circuit, for this process.

A number of approaches have been developed to overcome these problems. For example, U.S. Pat. No. 5,783,856, to Smith et al., entitled "Method for fabricating self-assembling microstructures," employs a fluidic self-assembly process to assemble trapezoidal shaped components dispersed in a solution onto a substrate having corresponding trapezoidal indentations. This approach uses gravity and convective fluid flow to deposit the components in the indentations. Limitations of this technique include: the use of relatively weak forces to dispose and hold the blocks in the indentations. It would further appear to be difficult to assemble a large variety of elements to the substrate due to the limited number of block and indent shapes that can realistically be fabricated.

U.S. Pat. No. 6,657,289, to Craig et al., entitled "Apparatus relating to block configurations and fluidic self assembly process," employs a fluidic self-assembly process to assemble components having at least one asymmetric feature dispersed in a solution onto a substrate having correspondingly shaped receptor sites. Limitations of this technique include: the use of relatively weak forces to dispose and hold the blocks in the shaped sites. It would further appear to be difficult to assemble a large variety of elements to the substrate due to the finite number of component shapes available.

U.S. Pat. No. 6,780,696, to Schatz, entitled "Method and apparatus for self-assembly of functional blocks on a substrate facilitated by electrode pairs," employs another fluidic self-assembly process to assemble trapezoidal shaped components dispersed in a solution onto a substrate having corresponding trapezoidal indentations. However, this approach couples electrodes to the substrate to form an electric field. The approach further forms the components of high-dielectric constant materials, such that the components are attracted to higher electric field regions and are thus guided to the trapezoidal indents. In another embodiment, the component is formed of a low magnetic permeability material, and a high magnetic permeability layer is coupled to the bottom surface of the component. A static magnetic field is generated at a receptor site by covering the receptor site with a permanent magnet having a north and a south pole aligned such that the static magnetic field is aligned parallel to the surface of the receptor site. In another embodiment, a magnetic field is applied parallel to the substrate. The slurry solution has an intermediate value of magnetic permeability. A drawback of this technique is that the components will tend to agglomerate in solution, due to the propensity of high magnetic permeability materials to agglomerate so as to minimize magnetic energy. Another possible limitation on this technique is registration error between the component and the substrate resulting from the use of magnetic fields aligned parallel to the substrate. In addition this technique would not lend itself to the assembly of multiple component types.

U.S. Pat. No. 3,439,416, to Yando, entitled "Method and apparatus for fabricating an array of discrete elements," forms pairs of magnets in a laminated base. Magnetic coatings, such as iron, are applied to the surface of elements. A multiplicity of elements is placed on the surface of the laminated base, which is then vibrated to move the elements. The magnetic coated surfaces of the elements are attracted to the pole faces of the magnet pairs. This technique suffers from several drawbacks, including severe limitations on the shape, size and distribution of the elements. For example, element width must match the spacing of the magnetic layers in the laminated base and the distribution of the elements is restricted by the parallel lamination geometry. In addition the technique appears to be applicable to relatively large, millimeter sized dimensions, and may not be suitable for smaller, micron-sized elements. In addition this technique would not lend itself to the assembly of multiple component types.

"Programmable assembly of heterogeneous colloidal particle arrays," Yellen et al., Adv. Mater. 2004, 16, No. 2, January 16, p. 111-115, employs magnetically programmable assembly to form heterogeneous colloidal particle arrays. This approach utilizes micromagnets that are covered with an array of square microwells and which are magnetized parallel to the plane. The substrate is immersed in a bath, and superparamagnetic colloidal beads are injected into the bath. External magnetic fields are applied perpendicular to the plane in a first direction, causing the beads to be attracted to one pole of the micromagnets. The direction of the external magnetic field is then reversed, causing the beads to be attracted to the other pole of the micomagnets. A drawback of this technique is that it is limited to two types of particles. Another limitation of this technique is that it requires the application of external magnetic fields and appears to be limited to superparamagnetic colloidal beads. Another limitation on this technique is use of microwells to trap the beads. Yield would also appear to be an issue.

It would therefore be desirable to provide systems and methods for fabricating high performance, large area electronics rapidly and inexpensively. It would further be desirable for the improved systems and methods to facilitate the assembly of a variety of different types of elements.

BRIEF DESCRIPTION

Briefly, one aspect of the present invention resides in a fluidic assembly method that includes dispersing a number of functional blocks in a fluid to form a slurry. Each of the functional blocks comprises at least one element and a patterned magnetic film comprising at least one region. The fluidic assembly method further includes immersing at least a portion of an article in the fluid. The article comprises a substrate, a number of receptor sites disposed on the substrate and a number of magnetic receptors. Each of the magnetic receptors is disposed within a respective one of the receptor sites.

Another aspect of the invention resides in a method of manufacturing an assembly. The method includes disposing a number of functional blocks over at least a portion of an article. The method further includes agitating the functional blocks relative to the article and assembling at least a subset of the functional blocks to the magnetic receptors on the article.

Yet another aspect of the invention resides in a heterogeneous, fluidic assembly method comprising dispersing a number of functional blocks of a first type in a first fluid to form a first slurry. The heterogeneous, fluidic assembly method further includes dispersing a number of functional blocks of a second type in a second fluid to form a second slurry. The type of functional block is characterized by at least one of: (a) a type of element incorporated in the functional block, (b) a number of elements incorporated in the functional block and combinations thereof. The heterogeneous, fluidic assembly method further includes immersing an article in the first fluid and immersing the article in the second fluid.

DRAWINGS

These and other features, aspects, and advantages of the present invention will become better understood when the following detailed description is read with reference to the accompanying drawings in which like characters represent like parts throughout the drawings, wherein:

FIG. 1 is a flow diagram illustrating an exemplary fluidic assembly embodiment of the invention;

FIG. 2 schematically depicts an exemplary article with two exemplary receptor sites for attachment to two exemplary functional blocks;

DETAILED DESCRIPTION

Figure 1:
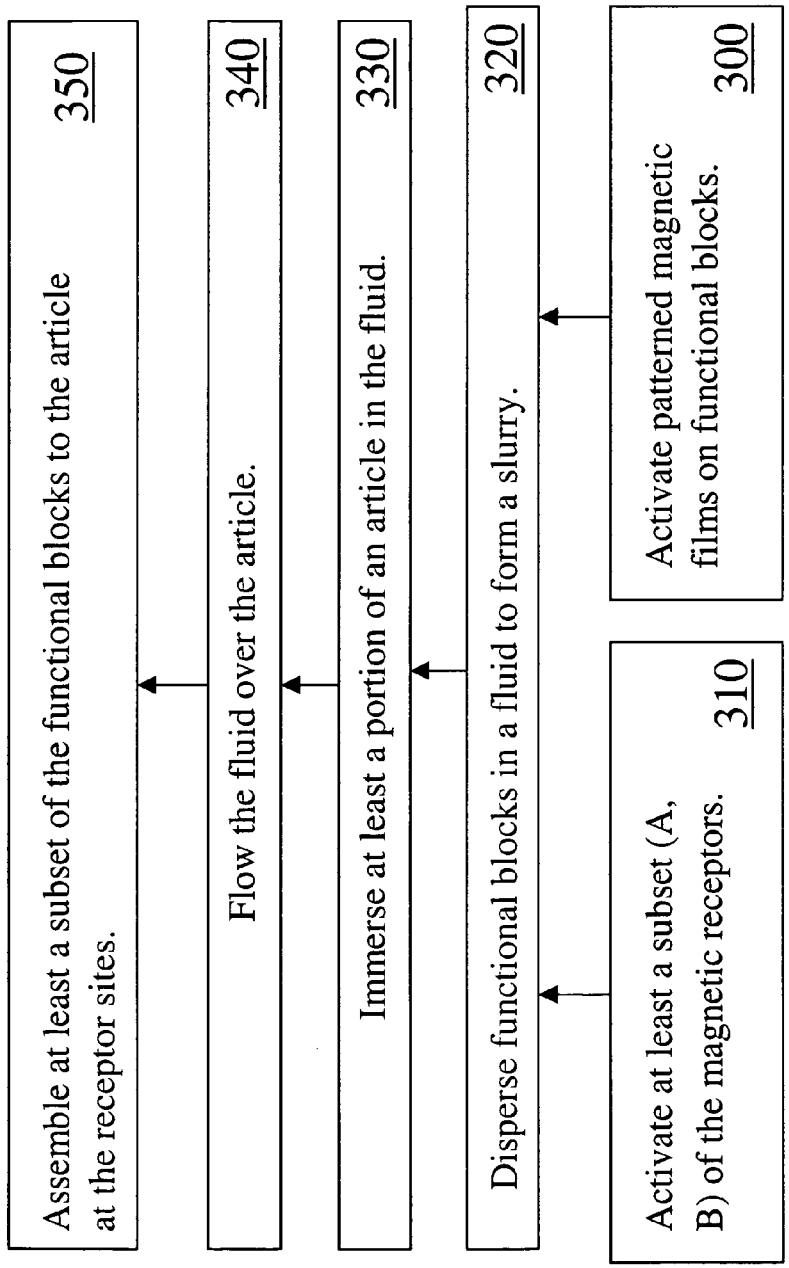
Figure 2:
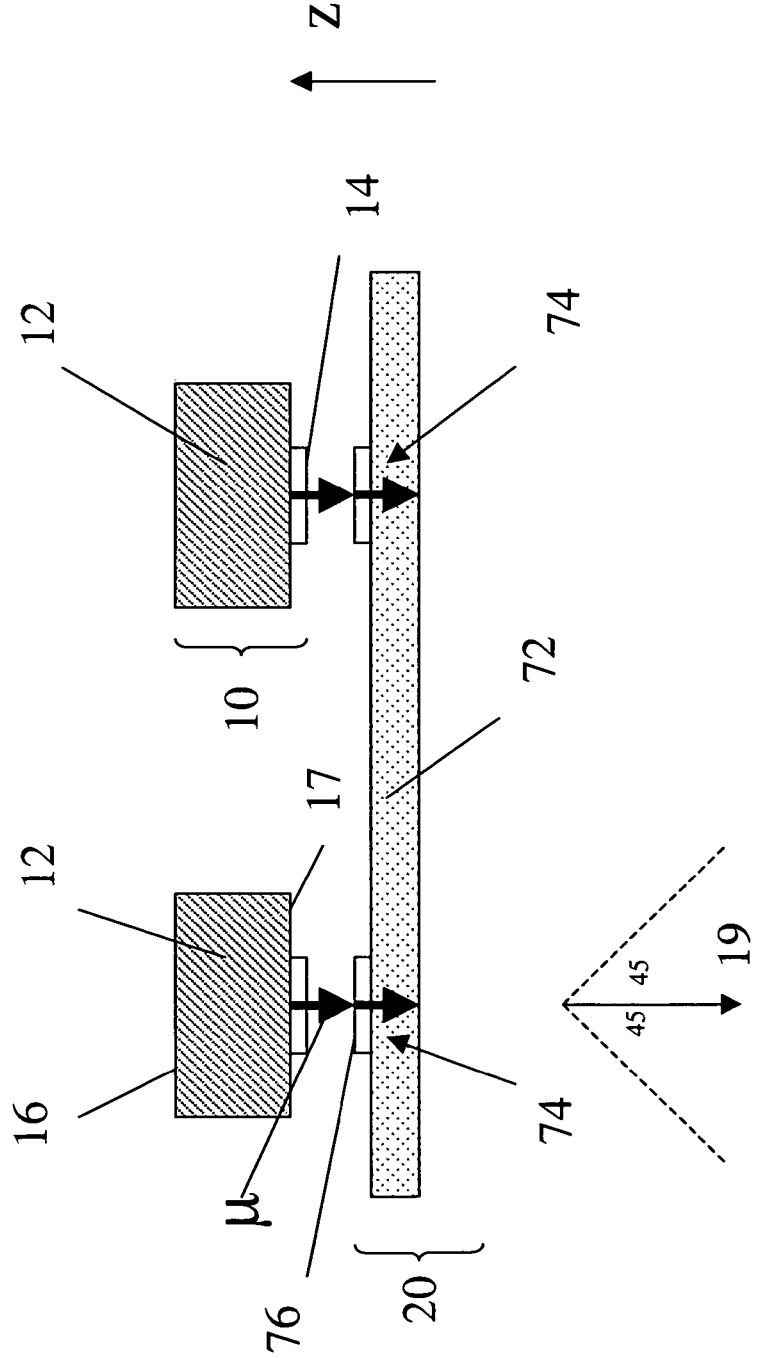

A fluidic assembly method is described with reference to FIG. 1. As indicated, for example, in FIG. 1, the fluidic assembly method includes at step 320 dispersing a number of functional blocks 10 in a fluid 66 to form a slurry 68. As used herein, the term 'dispersing' should be understood to mean that at least a subset of the functional blocks 10 in the fluid 66 are not agglomerated. The functional blocks 10 may dispersed in the fluid 66, for example, by adding the functional blocks 10 to the fluid 66 or by adding the fluid 66 to the functional blocks 10. Exemplary functional blocks 10 are depicted in FIG. 2. As shown, for example, in FIG. 2, each of the functional blocks 10 includes at least one element 12 and a patterned magnetic film 14 comprising at least one region 14. The functional blocks 10 are discussed in greater detail below. As indicated in FIG. 1, the fluidic assembly method further includes at step 330, immersing at least a portion of an article 20 in the fluid 66. An exemplary article 20 is depicted in FIG. 2. As shown, for example in FIG. 2, the article 20 includes a substrate 72, a number of receptor sites 74 disposed on the substrate 72 and a number of magnetic receptors 76. Each of the magnetic receptors 76 is disposed within a respective one of the receptor sites 74. The article 20 is discussed in greater detail below. As used herein, the term 'immerse' should be understood to encompass both introducing at least a portion of the article 20 into the fluid 66 and introducing the fluid 66 on at least a portion of the article 20, for example, poring or flowing the fluid on at least a portion of the article.

For the exemplary embodiment illustrated in FIG. 1, the fluidic assembly method further optionally includes at step 340, flowing the fluid 66 over the article 20 in order to flow the slurry 68 over the article 20. For a particular embodiment, the flowing step 320 comprises achieving a laminar flow of the fluid 66 over the article 20. In a laminar flow, the flow rate increases approximately quadratic as a function of distance from the walls of a container. Thus by achieving laminar flow, the functional blocks 10, positioned above receptor sites 74 will be experience a higher drag causing the blocks to drift until assembled at a receptor site 74. In a laminar flow regime, functional blocks 10 assembled to receptor sites 74 will experience lower drag forces, reducing the probability of the functional blocks 12 detaching from the receptor site 74. For certain embodiments, the fluid 66 is an incompressible fluid, non-limiting examples of which include water, alcohol, and non-polar liquids such as benzene. The fluid 66 may comprise a single liquid or a solution, one non-limiting example comprising a solution of de-ionized water and isopropyl alcohol. The fluid 66 may further include additives, such as polyethylene glycol, to prevent or reduce agglomeration of the functional blocks 10 in the fluid 66. For other embodiments, the fluid 66 is a compressible fluid, such as air. For these compressible fluid embodiments, the flowing step may be performed, for example, using a stream of air.

The functional blocks 10 are described in detail in Huber et al., "Functional blocks for assembly and method of manufacture." Briefly, the present invention can be used with a wide variety of elements 12, and exemplary elements 12 include without limitation semiconductor devices, passive elements, photonic band-gap elements, luminescent materials, sensors, micro-electrical mechanical systems (MEMS) and energy harvesting devices (such as photovoltaic cells). As used here, the term "passive element" should be understood to refer to passive circuit elements, non-limiting examples of which include resistors, capacitors, inductors, and diodes. Exemplary semiconductor devices 12 include, without limitation, transistors, diodes, logic gates, amplifiers and memory circuits. Examples of transistors include, without limitation, field effect transistors (FETs), MOSFETs, MISFETs, IGBTs, bipolar transistors and J-FETs. The semiconductor devices may for example comprise Si, GaN, GaAs, InP, SiC, SiGe or other semiconductors.

A functional block 10 may include a single element 12 or a group of elements 12. A group of elements 12 for a functional block 10 may include different types of elements. For example, a functional block may comprise multiple transistors configured as a digital logic gate or an analog amplifier.

Figure 3:
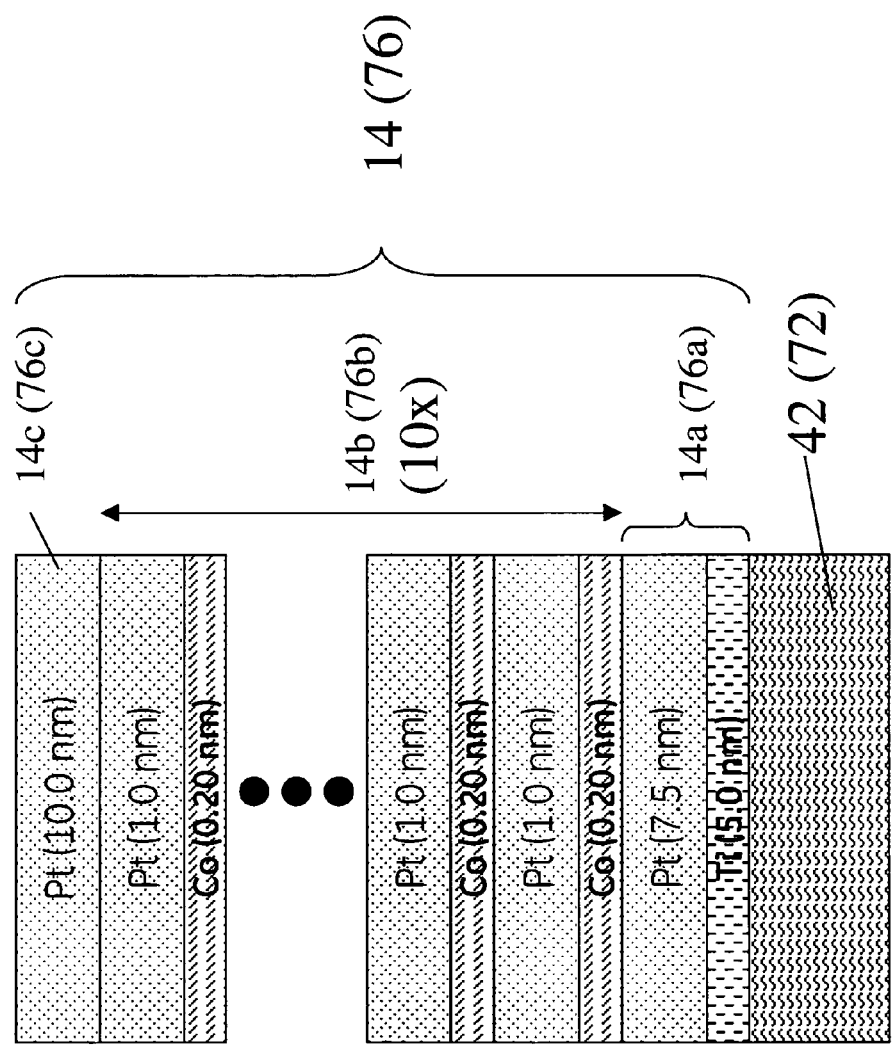
FIG. 3 depicts an exemplary multilayer magnetic film.

As used herein, the term "film" refers to a structure having one or more layers. FIG. 3 illustrates an example multilayer film embodiment. For particular embodiments, the thickness of the structure is less than or equal to 100 microns. In other embodiments, non-magnetic spacer layers (not shown) are included, and the thickness of the structure is less than about one mm. For the arrangement shown in FIG. 2, the thickness of the film 14 is measured in the z direction. By "patterned" it is meant that the film has a shape, such that it does not extend across the entire surface of the element 12. The film 14 can be patterned using lithographic techniques, for example. An exemplary patterning process for patterning an un-patterned magnetic film to form a patterned magnetic film 14 is described in Huber et al., "Functional blocks for assembly and method of manufacture." The patterned magnetic film 14 comprises one or more magnetic regions (also indicated by reference numeral 14). The magnetic region(s) 14 could be formed on the connecting surface 17 of the element 12, could be formed on an intermediate layer (not shown), could be disposed in the element 12 and either contained within the element 12 or extend past the connecting surface 17.

As discussed in Huber et al., "Functional blocks for assembly and method of manufacture," for certain embodiments, the functional block 10 includes a number of magnetic regions 14. In other embodiments, the functional block has a single magnetic region 14. Further, it should be noted that the magnetic region 14 may have any shape and may be symmetric or asymmetric. The depicted shapes for the regions 14 are merely illustrated examples.

Moreover, the magnetic region 14 may be rotationally symmetric or asymmetric about an axis that is perpendicular to the surface of the magnetic region. As used herein, the term "rotationally symmetric" refers to geometries wherein any rotation of the functional block 12 around an axis perpendicular to the magnetic film 14, does not affect the position of the patterned magnetic film 14 or the contacts 24.

EXAMPLE

The patterned magnetic film 14 may be fabricated from a variety of different materials using a variety of different techniques. For example, a perpendicular magnetic film may be constructed as a multilayer film (also indicated by reference numeral 14). In one non-limiting example illustrated by FIG. 3, a multilayer magnetic film 14 is constructed by sequentially depositing a series of individual layers comprising a base region 14a, an active region 14b and a capping region 14c. The multilayer film 14 may be deposited using a variety of different deposition processes, non-limiting examples of which include electron beam evaporation, sputtering, resistive source evaporation and electroplating.

In one non-limiting example, a perpendicular magnetic film may be generated via electron beam evaporation of Cobalt/Platinum multilayers in the active region 14b. For the example illustrated by FIG. 3, the base region 14a comprises approximately 5.0 nm of Titanium (Ti) followed by approximately 7.5 nm of Platinum (Pt). The active region 14b for this example comprises a multilayer stack wherein approximately 0.2 nm of Cobalt (Co) is alternated with approximately 1.0 nm of Pt to build an active region 14b with approximately 10 layers of Co. For this example, the capping region 14c comprises approximately 10 nm of Pt. For the exemplary structure of FIG. 3, the multilayer film 14 is formed on a substrate 42. According to a one non-limiting example, the substrate 42 is a SOI substrate.

Returning now to the general description of the invention, each of the elements 12 has a connecting surface 17. For the exemplary embodiment illustrated by FIG. 1, the fluidic assembly method further includes at step 300, activating the patterned magnetic films 14 to exhibit respective magnetic moments μ. In one example, the magnetic moments μ are oriented in a range of plus or minus forty-five degrees from the surface normal 19 for the respective connecting surface 19. In a more particular example, the magnetic moments μ are oriented in a range of plus or minus ten degrees from the surface normal 19 for the respective connecting surface 19. For the exemplary embodiment of FIG. 2, the magnetic moment μ is aligned along the surface normal 19 for the connecting surface 17. Beneficially, by aligning the magnetic moment μ of the patterned magnetic film 14 along the surface normal 19, connecting surfaces 17 of multiple elements 12 will repulse each other. In this manner, the tendency of the functional blocks 10 to agglomerate when dispensed in slurry, is reduced. As indicated in FIG. 1, the activating step 300 is performed prior to the dispersing step 320. In one non-limiting example, the activating step 300 is performed by applying an external magnetic field that is larger than the coercivity of the patterned magnetic films 14. As discussed in Huber et al., "Functional blocks for assembly and method of manufacture," the coercivity $H_c$ of the patterned magnetic film 14 should be selected such that the magnetic films 14 preserve their magnetic moments μ for assembly to the article 20. As used here, the coercivity $H_c$ is the applied field required to reverse the magnetic moment μ.

For particular embodiments, the patterned magnetic films 14 comprise a material with a perpendicular magnetic anisotropy. For more particular embodiments, the patterned magnetic film 14 comprises a multilayer structure, as illustrated by FIG. 3, for example.

Figure 4:
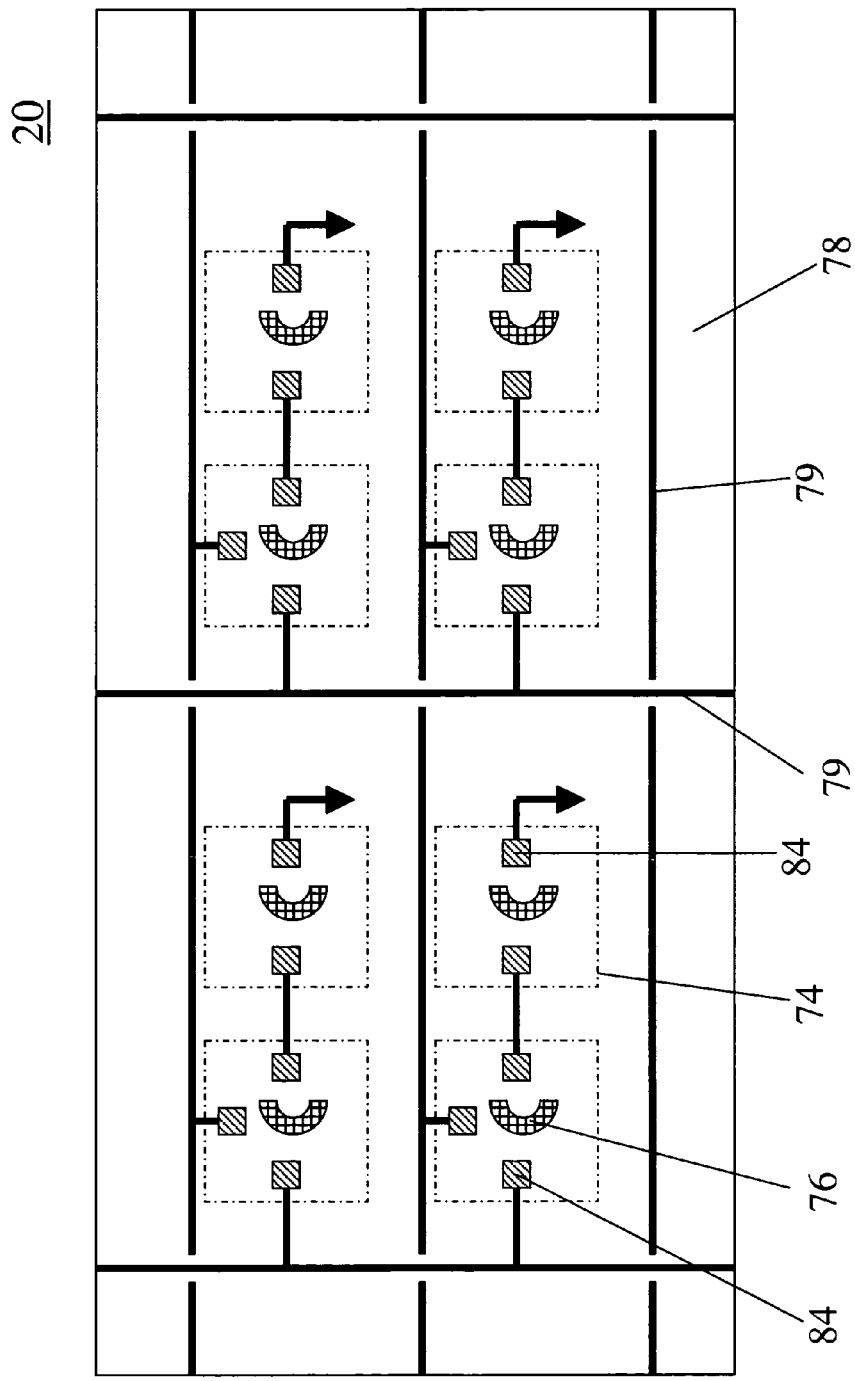
FIG. 4 is a top view of an interconnect layer on an exemplary article.
Figure 5:
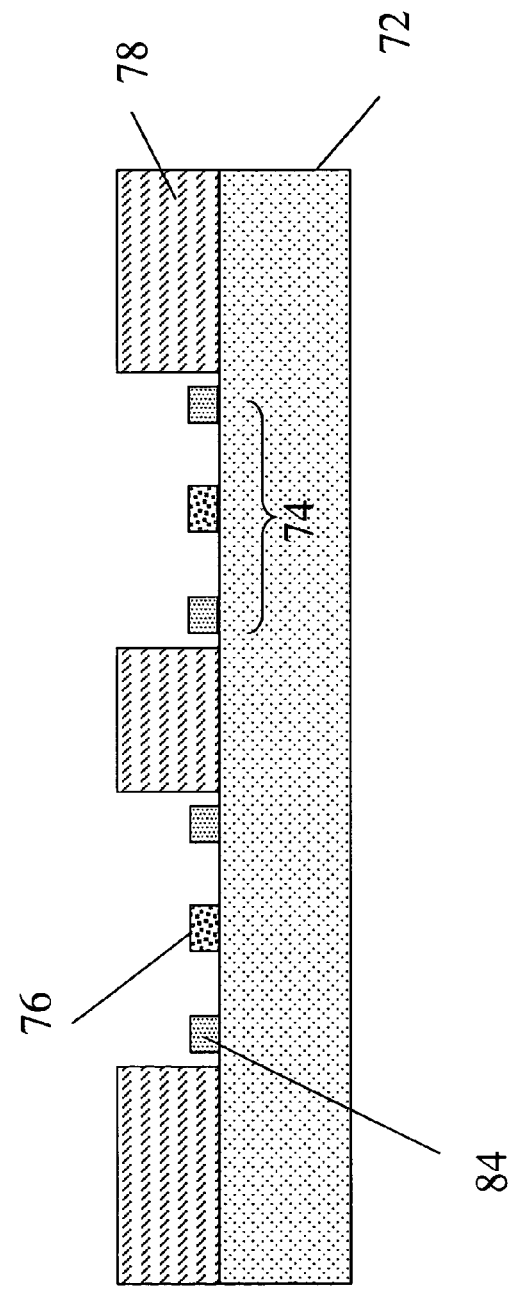
FIG. 5 is a side view of the article of FIG. 4.

Article 20 is described in detail in Huber et al., "Article and assembly for magnetically directed self assembly." Briefly, as shown for example in FIGS. 4 and 5, for certain embodiments the article 20 further includes at least one interconnect layer 78 attached to the substrate 72, in order to provide electrical connections between receptor sites 74 for the respective functional blocks 10. FIG. 4 is a top view of an exemplary interconnect layer 78 and as shown, includes a number of connections 79 for interconnecting the functional blocks 10 to be assembled at the receptor sites 74. Contacts 84 are provided for the receptor sites 74. FIG. 5 is a side view of the article 20 shown in FIG. 4. Connections 79 and contacts 84 can be formed of a variety of conductive materials, non-limiting examples of which include Copper, Gold, Tin, Silver, Indium, Bismuth, Lead and alloys thereof. Exemplary, non-limiting, interconnect layers include Copper on Kapton® and Gold on Kapton®.

Depending on the application, the receptor sites may be recessed within the substrate, may be level with the substrate 72 or may protrude from the substrate. In particular embodiments, one or more of the receptor sites are recessed, protrude and/or are level with the substrate. Further, the receptor sites 74 may be shaped. The receptor sites 74 may also be embossed within the substrate 72.

The substrate 72 may take many forms. For particular embodiments, the substrate 72 is flexible. In one non-limiting example, the flexible substrate 72 comprises polyimide. Other non-limiting examples include polycarbonate, liquid-crystal polymer and polyetherimide. Polyimide is an organic polymer, examples of which include materials marketed under the trade names Kapton® and Upilex®. Upilex® is commercially available from UBE Industries, Ltd., and Kapton® is commercially available from E. I. du Pont de Nemours and Company. According to a particular embodiment, the substrate comprises a sheet of a flexible material, such as polyimide. Such flexible substrates desirably lend themselves to low-cost manufacture of the assembly 20 using roll-to-roll fabrication techniques, as discussed below. Other benefits to the use of flexible substrates 72 include providing a robust article 20, as compared to conventional articles formed on rigid silicon or glass substrates, for example.

For other applications, the substrate 72 may be rigid, non-limiting examples of which include silicon and glass. In addition to being applicable to a wide variety of substrate materials, the substrate may have a variety of geometries and shapes. For example, for certain embodiments, the substrate 72 is a curved, rigid object, non-limiting examples of which include, for example, turbine blades and aircraft fuselages.

The coercivity $H_c$ of the patterned magnetic film 76 should be selected such that the magnetic films 74 preserve their magnetic moments μ during assembly of the functional blocks 10 to the article 20. For particular embodiments, the patterned magnetic film 76 is characterized by a coercivity $H_c$ of at least about ten Oersteads (Oe). According to more particular embodiments, the coercivity ($H_c$) is at least about thirty Oe, and still more particularly, at least about one hundred (100) Oe, and still more particularly, at least about one thousand (1000) Oe.

Figure 6:
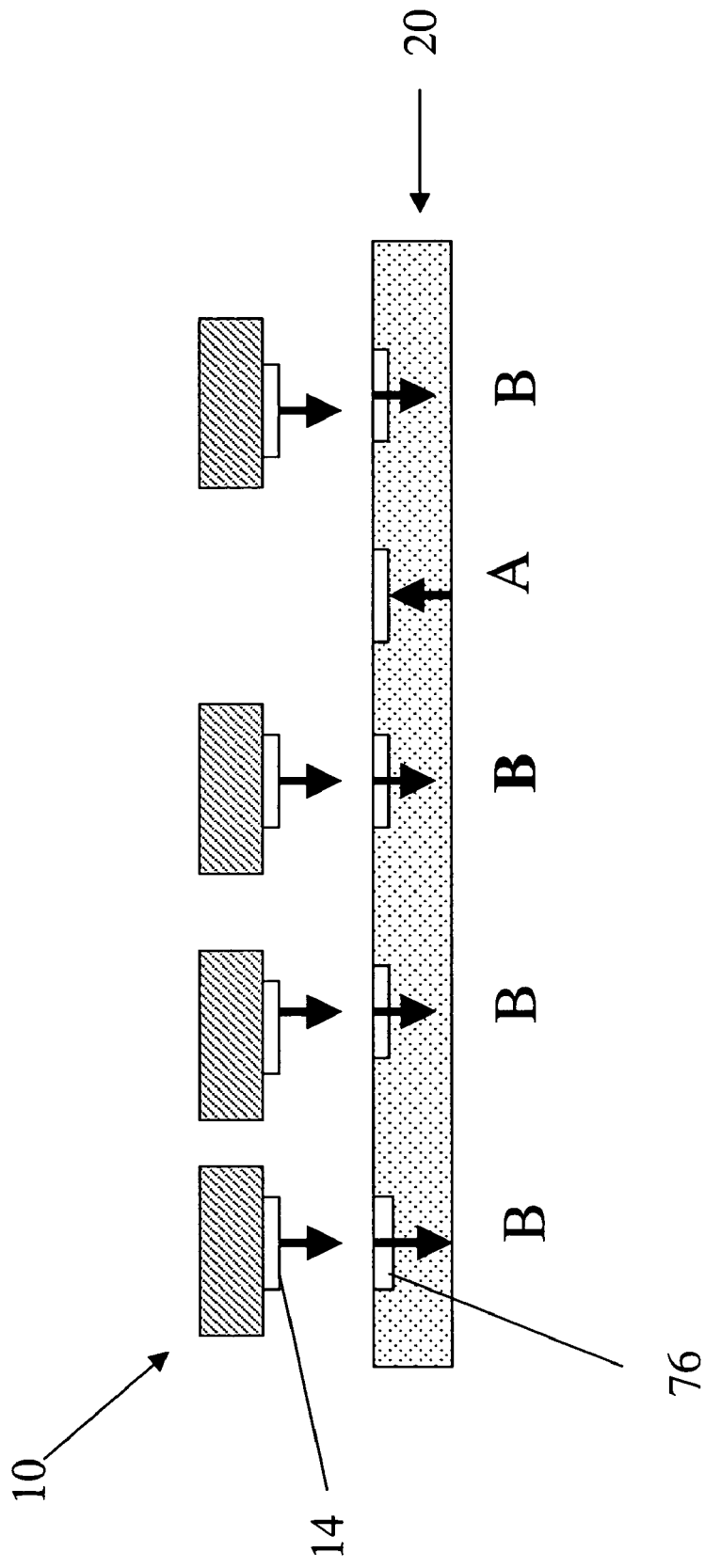
FIG. 6 illustrates an exemplary heterogeneous self-assembly embodiment of the invention.

Returning now to FIG. 1, the fluidic assembly method further includes at step 310, activating at least a subset (A, B) of the magnetic receptors 76 to generate respective magnetic field gradients for attracting respective ones of the patterned magnetic films 14. In many embodiments, the magnetic receptors 76 are activated prior to immersion of the article 20 in the fluid 66. However, for other embodiments the magnetic receptors 76 may be activated while the article 20 is immersed in the fluid 66. Exemplary subsets (A, B) are indicated in FIG. 6, for example. The magnetic receptors 76 may be grouped into 1-N subsets, where N is an integer. Although the illustrated examples include two subsets A, B, it should be understood that the invention embraces any number of subsets 1-N and advantageously is adapted for many such subsets. According to a particular embodiment, the activating step 310 comprises activating all of the magnetic receptors 76 on the substrate 72.

According to particular embodiments, the magnetic receptors 76 comprise patterned magnetic films 76 comprising at least one material with a perpendicular magnetic anisotropy. An exemplary (un-patterned) magnetic film is shown in FIG. 3 and can be patterned using lithographic techniques, for example. For the exemplary embodiment illustrated by FIG. 1, the activating step 310 is performed prior to the immersing step 330.

Figure 7:
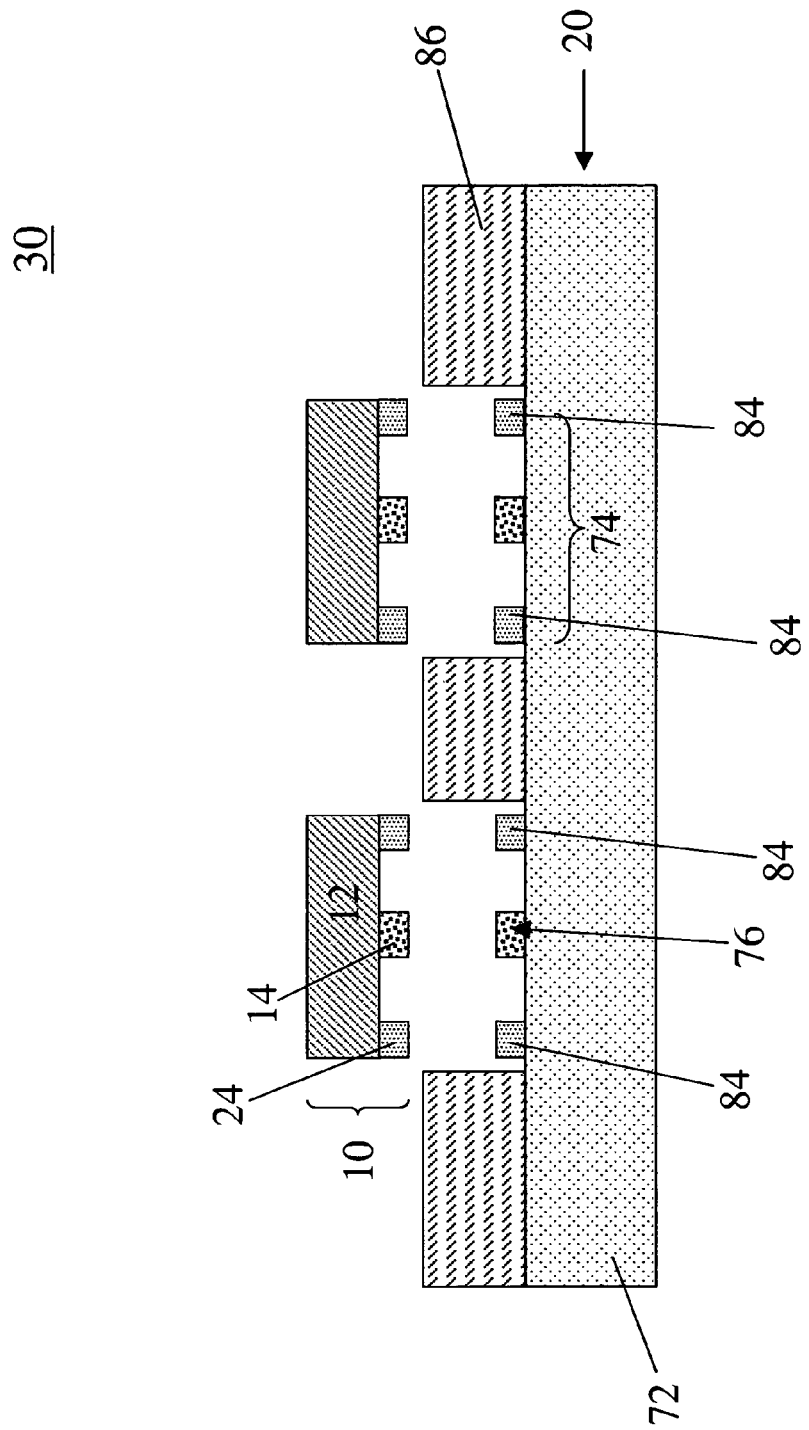
FIG. 7 illustrates the assembly of two exemplary functional blocks to an exemplary article.

Returning to the exemplary technique illustrated in FIG. 1, the fluidic assembly method includes at step 300 activating the patterned magnetic films 14 prior to performing the dispersing step 320 and at step 350 assembling at least a subset of the functional blocks 10 to the article 20 at the receptor sites 74 using the magnetic field gradients generated by the magnetic receptors 76. FIG. 7 illustrates the assembly of two exemplary functional blocks 10 to an exemplary article 20. For the example embodiment shown in FIG. 7, the contacts 24, 84 are front contacts. For the example embodiment shown in FIG. 21, the contacts 24, 84 are side contacts. For the example embodiment shown in FIG. 22, the contacts 24, 84 are back contacts, and the assembly 30 further includes encapsulating layer 85 and connections 79. In other embodiments (not expressly shown), the configuration for contacts 24, 84 combines front, and/or side and/or back contact configurations.

Figure 8:
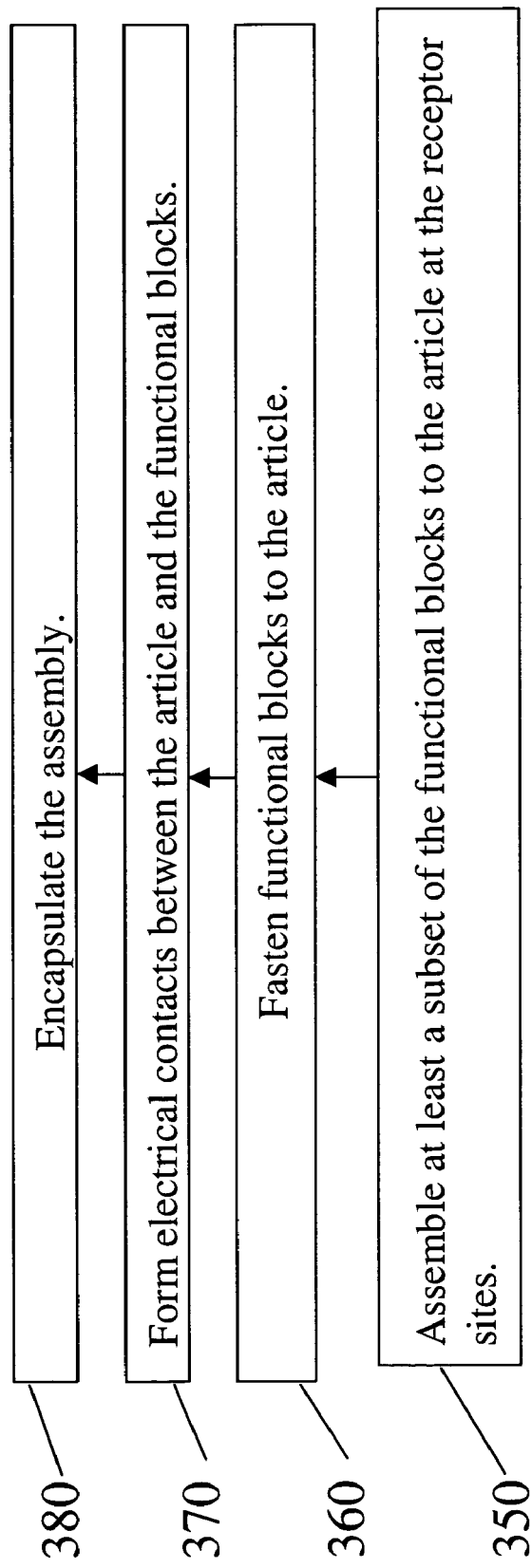
FIG. 8 is a flow diagram illustrating additional exemplary processing steps for assembly embodiments of the invention.
Figure 21:
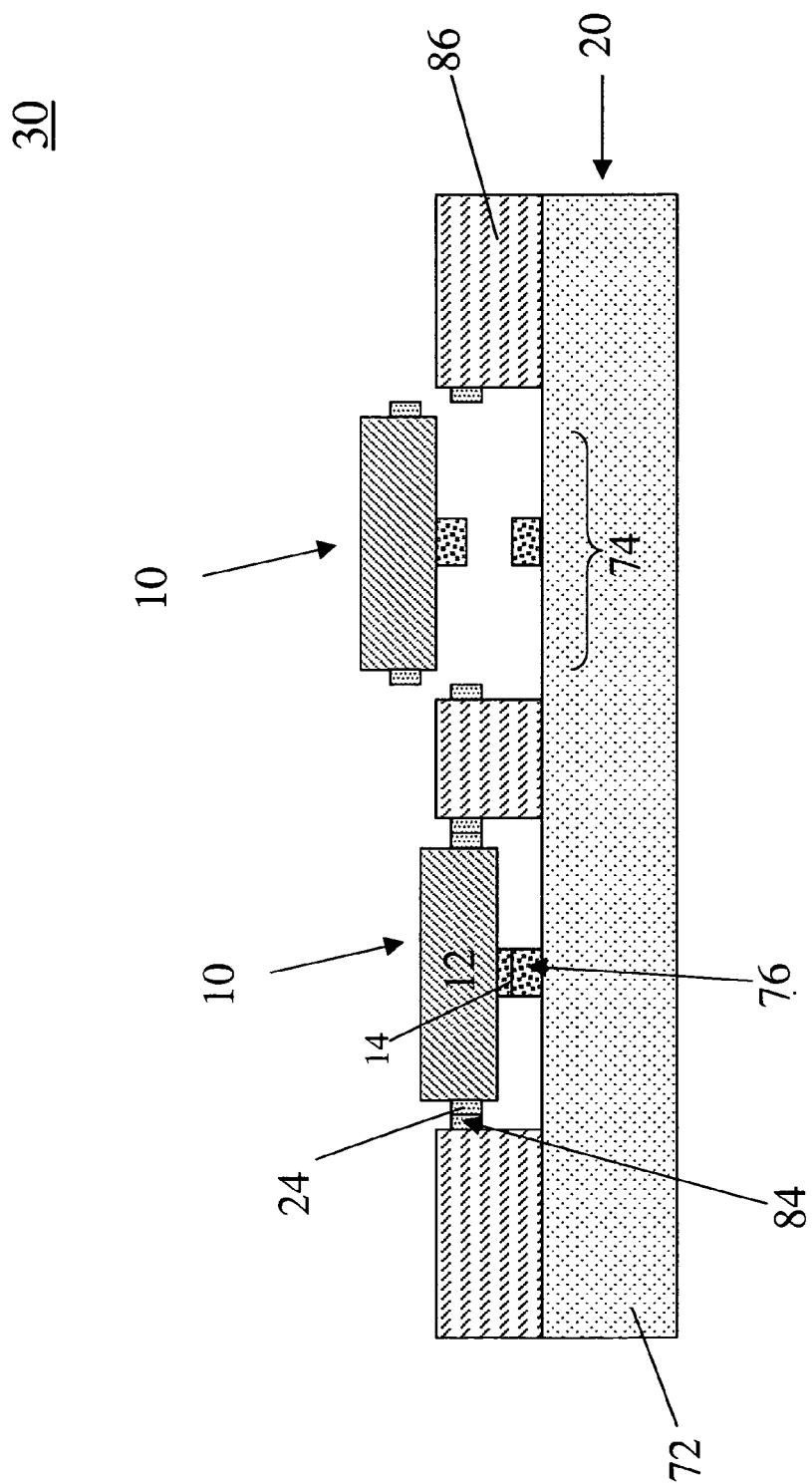
FIG. 21 shows an example assembly configuration with side contacts.
Figure 22:
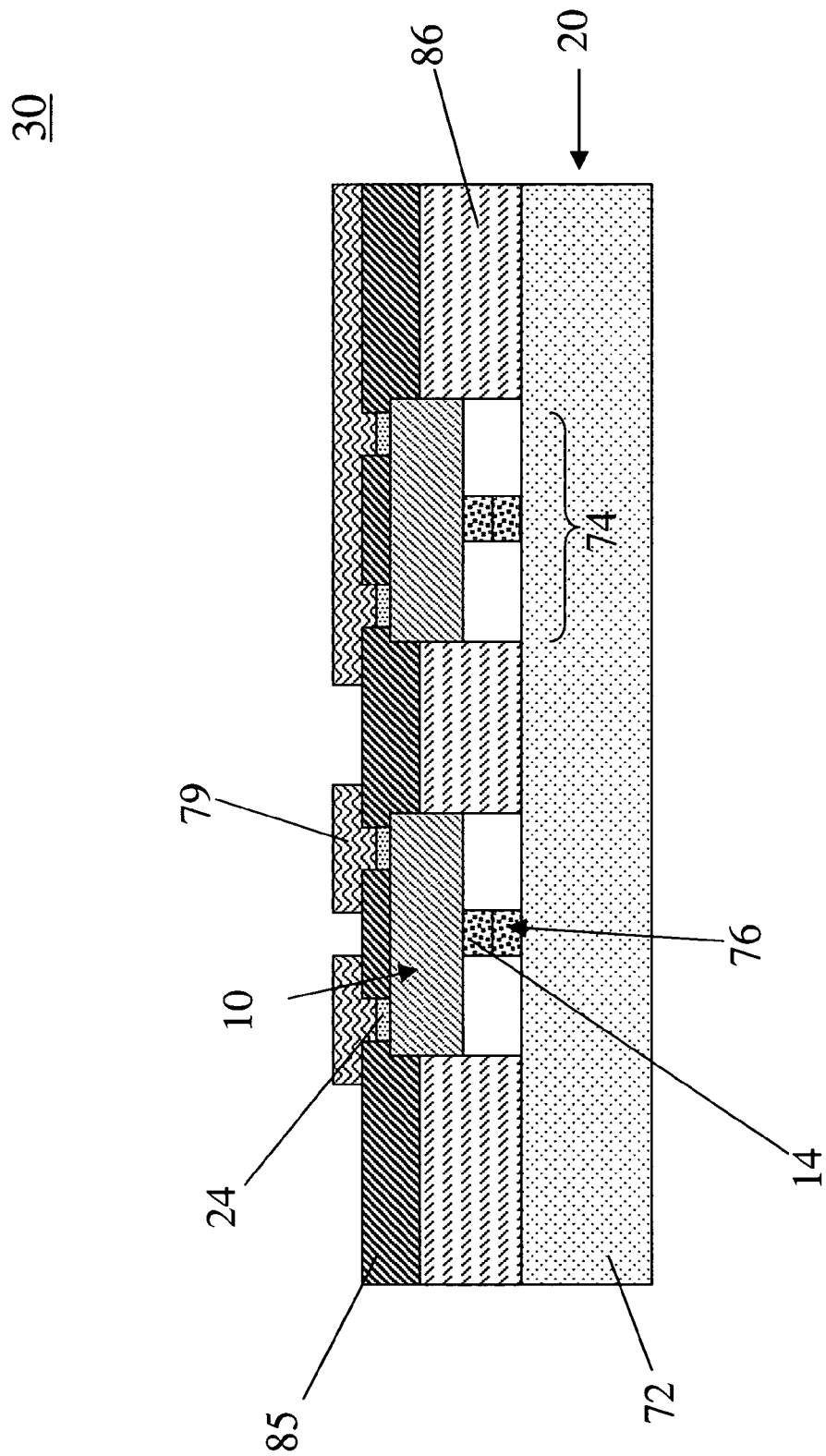
FIG. 22 shows an example assembly configuration with back contacts.

After assembly, it is desirable to secure the functional blocks 10 to the article 20. Accordingly, the fluidic assembly method further includes at optional step 360 fastening the functional blocks 10 to the article 20 after the assembling step 350, as indicated in FIG. 8. For certain embodiments, the fastening step 360 is performed using a number of contacts 24 and 84. Exemplary block contacts 24 and article contacts 84 are shown in FIGS. 7, 21 and 22, for example. The contacts 24 and 84 may include solder. Non-limiting examples of contact materials suitable for fastening include solders, such as Indium, Tin, Lead, Bismuth, Silver, Cadmium, Zinc and various alloys. The solder may be deposited on a gold or other conductive film, for example, forming a layered structure. The solder may be deposited on the contacts 24 on the functional blocks 10 and/or deposited on the article 20. For other embodiments, the fastening step 360 is performed using an activated adhesive (not shown). Prior to fastening, the adhesive may be attached to the substrate 72 or to the functional blocks 10. In addition, the fluidic assembly method illustrated in FIG. 8 further includes at optional step 370, forming a number of electrical contacts 84 between the article 20 and the functional blocks 10.

Figure 9:
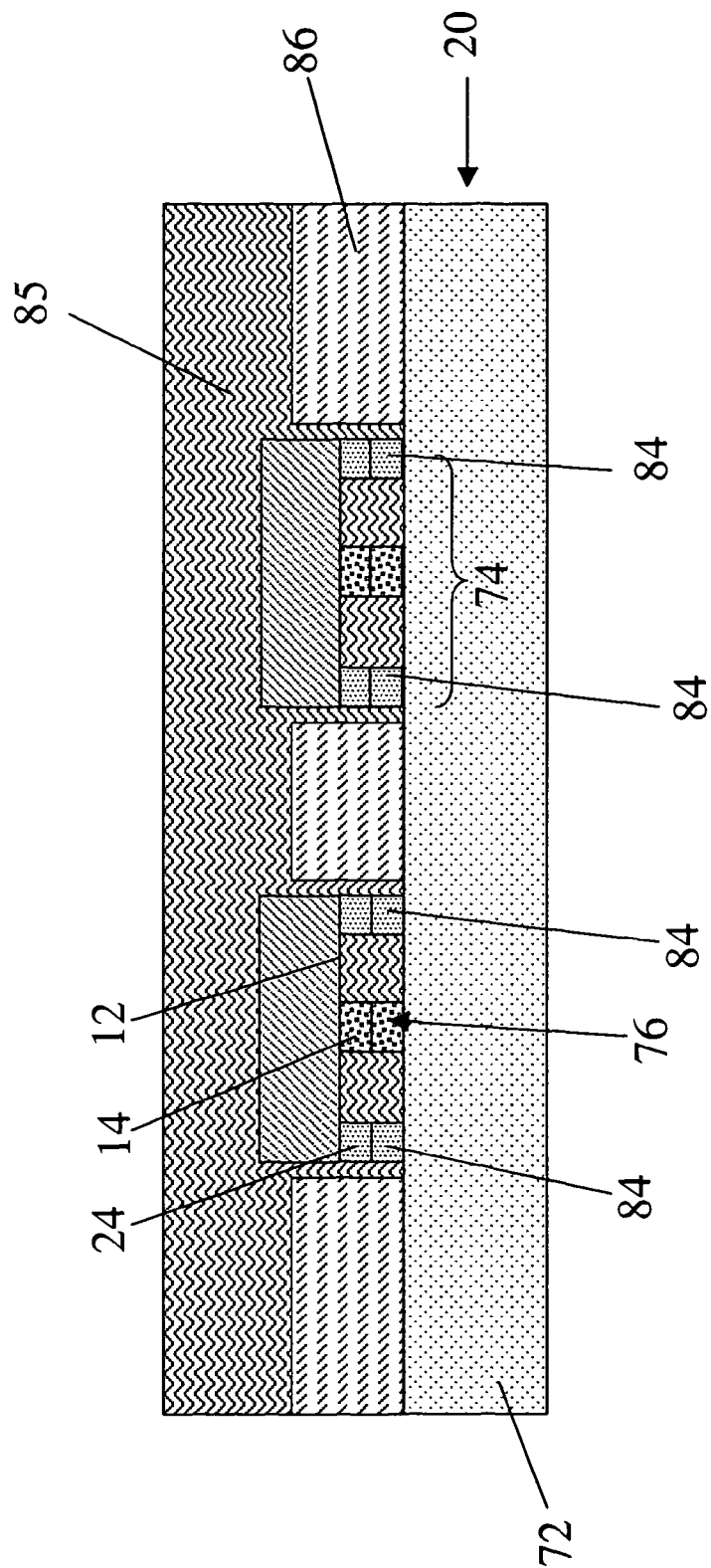
FIG. 9 shows an exemplary encapsulated assembly.

As indicated in FIG. 8, the fluidic assembly method further optionally includes at step 380 encapsulating the assembly 30. FIGS. 2 and 7 show exemplary assemblies 30. For the exemplary embodiment shown in FIG. 9, the encapsulation step comprises forming an encapsulation layer 85 over the assembled blocks 10 and article 20. In one nonlimiting example, the encapsulation layer 85 comprises BCP or parylene or other materials used for passivation of semiconductor devices. The encapsulation step 380 provides a relatively flat surface for any subsequent processing. In certain embodiments, the encapsulation step 380 also serves to passivate the functional blocks 10 by protecting the functional blocks 10 from environmental contamination.

A heterogeneous, fluidic assembly method is described with reference to FIGS. 1 and 10. For the heterogeneous, fluidic assembly method shown in FIG. 10, the dispersing step 320 comprises at sub-step 322 dispersing a number of functional blocks 10 of a first type A in the fluid 66 to form the slurry 68. Depending on the application, the type of functional block 10 is characterized by at least one of: (a) the type of element(s) 12 incorporated in the functional block 10, (b) the number of elements 12 incorporated in the functional block 10 and combinations thereof. For the method shown in FIG. 10, the activating step 310 comprises at sub-step 312 activating a first subset of the magnetic receptors A. In one example, none of the magnetic receptors 76 on article 20 has been magnetized in an initial state. The assembling step 350 comprises at sub-step 352 assembling the functional blocks 10 of the first type A to respective ones of the first subset A of magnetic receptors 76. For the illustrated embodiment, the heterogeneous fluidic assembly method further includes repeating the activating step 312, the dispersing step 320, the immersing step 330 and the assembling step 350 for at least a number of functional blocks 10 of an nth type and a corresponding nth subsets of the magnetic receptors 76, where n is an integer and n≧2.

Figure 11:
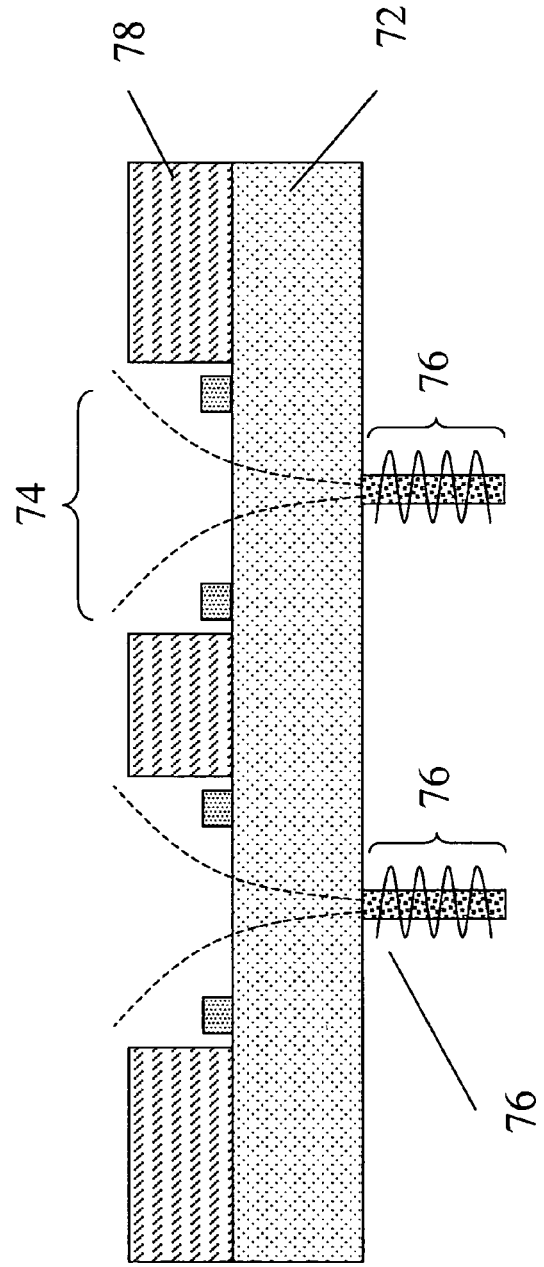
FIG. 11 illustrates an exemplary use of electromagnet-based receptors.
Figure 12:
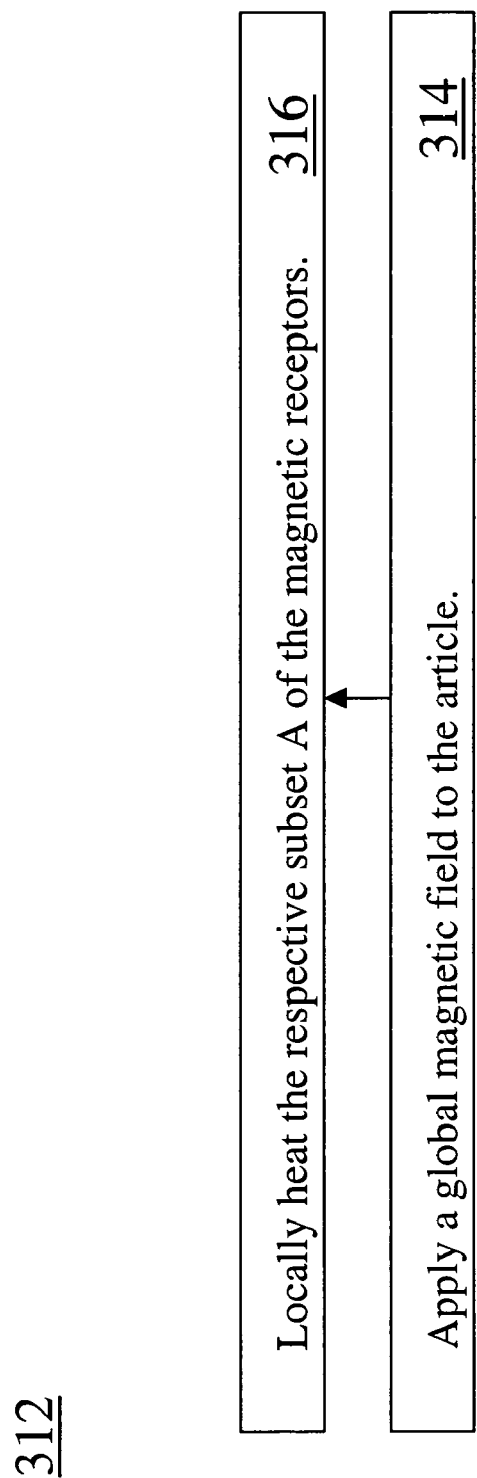
FIG. 12 illustrates an exemplary technique for activating a subset of magnetic receptors.

The magnetic receptors 76 can be activated using a variety of techniques. For the exemplary embodiment depicted in FIG. 11, the activating step 312 comprises activating a number of coils. In one example, there are coils 76 at each of the receptor sites 74. For this example, a respective subset A of the coils 76 are activated either to magnetize respective films 76 at sites A (this embodiment is not expressly shown) or to serve as magnetic receptors 76 at sites A (as shown, for example in FIG. 11). FIG. 12 illustrates another exemplary technique for activating a subset of magnetic receptors 76. As indicated, for example, in FIG. 12, the activating sub-step 312 comprises at sub-step 314, locally heating the respective subset A of the magnetic receptors 76, for example using local heat source 400 (one non-limiting example of which includes a laser) as shown for example in FIG. 13, and at sub-step 316, applying a global magnetic field to the article 20, in order to magnetize the magnetic receptors within subset A. In the above example, the global magnetic field is larger than the coercivity of the heated magnetic region but lower than the coercivity of the unheated magnetic regions. As illustrated for example in FIG. 14, for yet another embodiment, the activating sub-step 312 comprises applying local magnetic fields to the respective subset A of the magnetic receptors 76, in order to magnetize the magnetic receptors within that subset A. Although FIG. 14 illustrates a bit-flipping embodiment, local magnetic fields can be applied with local source 402 for the above-mentioned case of an initial state with no magnetization of the magnetic receptors 76. For this later case, there would be no net magnetic moments μ at the subset of sites 74 labeled B in FIG. 14.

Figure 10:
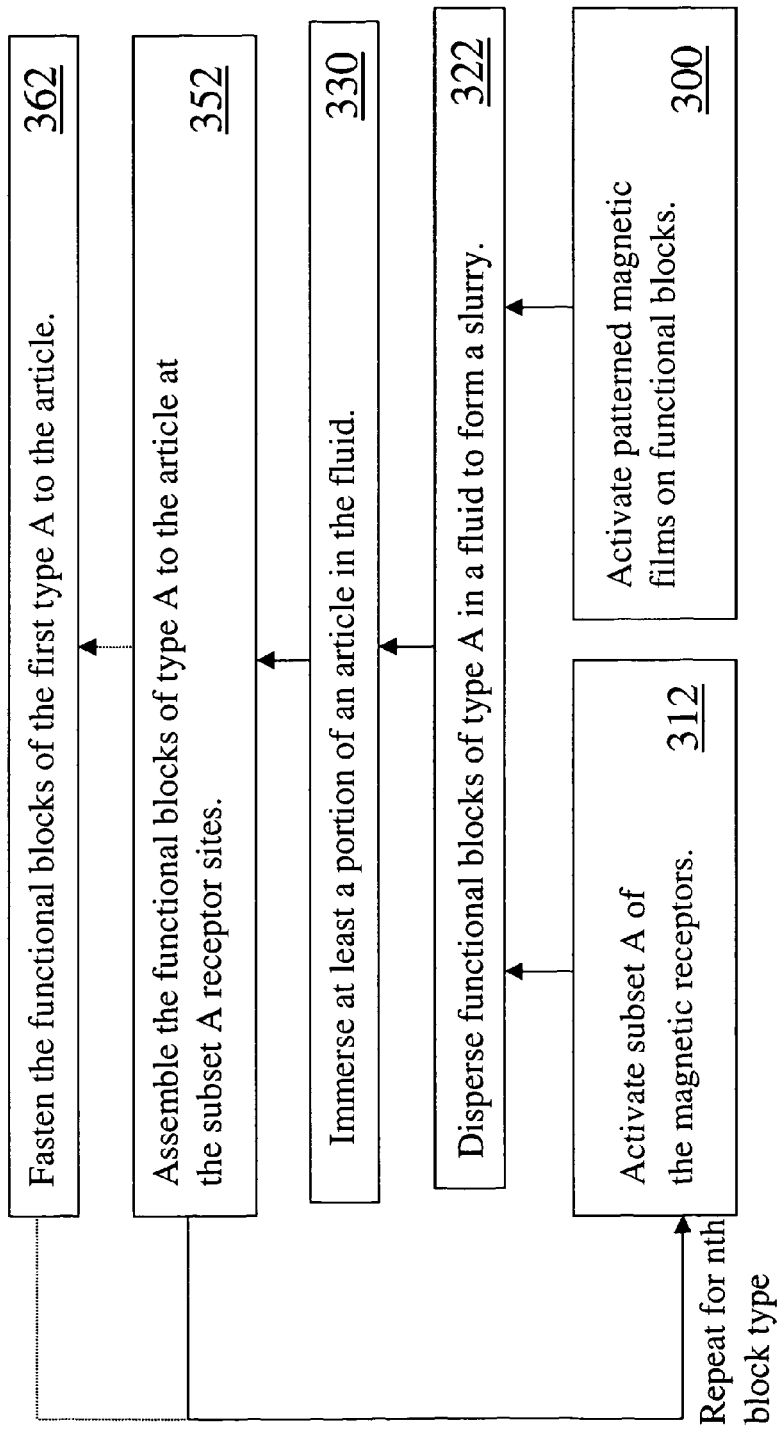
FIG. 10 illustrates a heterogeneous, fluidic assembly method embodiment of the invention.

For the exemplary embodiment illustrated in FIG. 10, the heterogeneous, fluidic assembly method further optionally includes at sub-step 362 fastening the functional blocks 10 of the first type A to the article 20 after the assembling sub-step 352 for the functional blocks 10 of the first type A. As indicated in FIG. 10, the heterogeneous, fluidic assembly method further includes repeating the fastening step 362 for the functional blocks 10 of the nth type.

Figure 16:
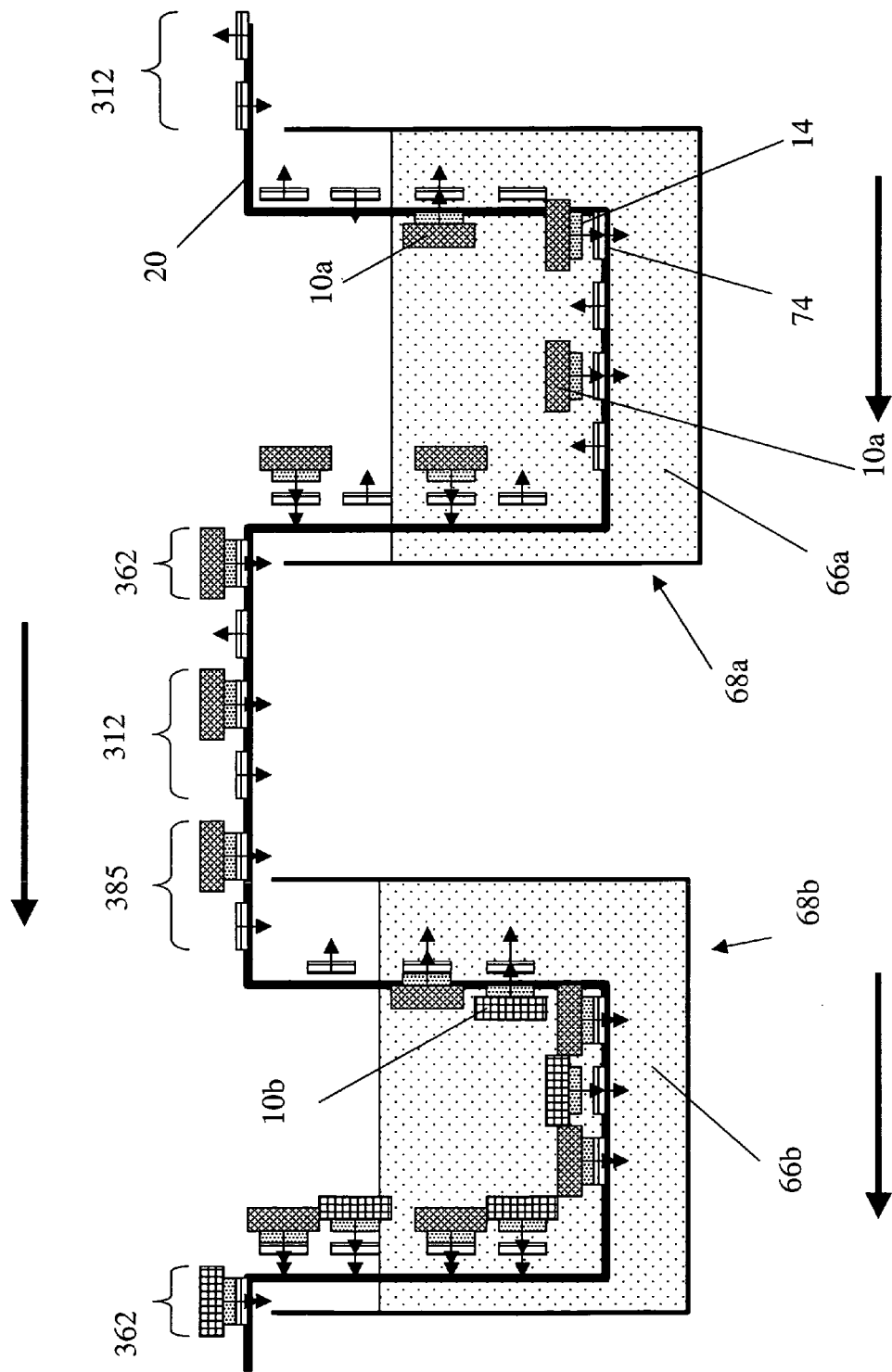
FIG. 16 illustrates an exemplary heterogeneous, fluidic assembly embodiment of the invention.
Figure 17:
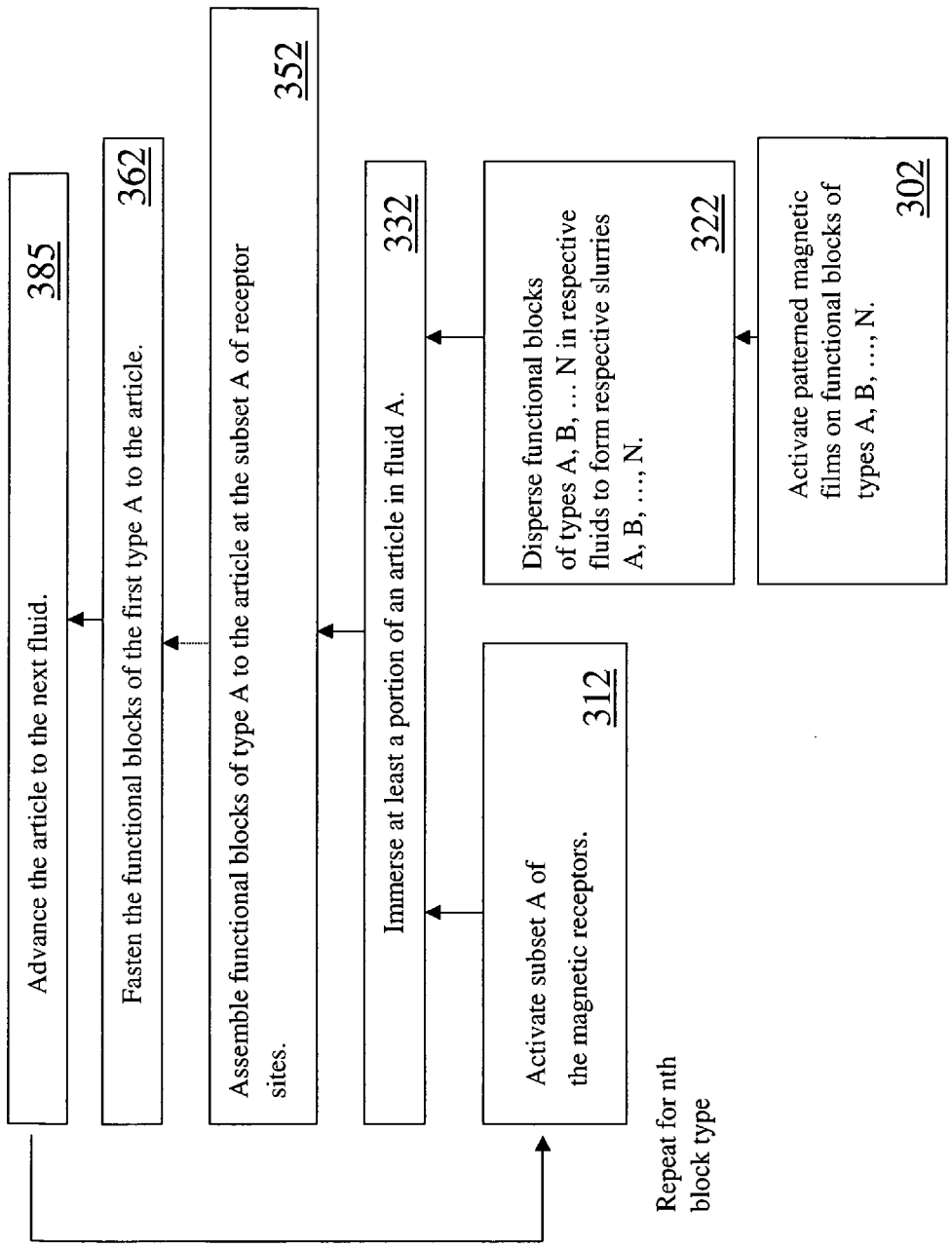
FIG. 17 is a flow diagram illustrating the exemplary heterogeneous, fluidic assembly method of FIG. 16.

Depending on the application, single or multi-fluid assembly embodiments may be employed. FIGS. 16 and 17 illustrate an exemplary multi-fluid embodiment of the invention. For the exemplary embodiment, repetition of the dispersing step 320 comprises at sub-step 322 dispersing the functional blocks 10 of the nth type in an nth fluid 66 to form an nth slurry 68. It should be noted that the types of containers for the fluids shown in FIG. 16 are purely illustrative. Similarly, the use of two slurries in FIG. 16 is merely one non-limiting example of this multi-slurry embodiment. For the exemplary embodiment illustrated by FIG. 16, repetition of the immersing step 330 comprises at sub-step 332 immersing the article 20 in the nth fluid, and repeating the assembling step 350 comprises at step 352 assembling the functional blocks of the nth type to an nth subset of the magnetic receptors 76 on the article 20. For the particular embodiment illustrated by FIGS. 16 and 17, the fluidic assembly method further includes at step 385 advancing the article 20 through the first through nth fluids. For the example shown in FIG. 16, the article 20 is advanced from right to left, as indicated by the arrows. More particularly, article 20 is first immersed in slurry 68a to assemble blocks 10a to the article 20, and then article 20 is immersed in slurry 68b to assemble blocks 10b to the article 20. According to a particular embodiment, the advancing step 385 is performed using a roll-to-roll process. Roll-to-roll fabrication techniques employ a variety of processes, non-limiting examples of which include gravure printing, flexo printing, ink jet printing, screen printing and offset printing. Other roll-to-roll fabrication processes utilize processes adapted from traditional batch processes such as photolithography, sputtering and wet chemical etching.

Figure 18:
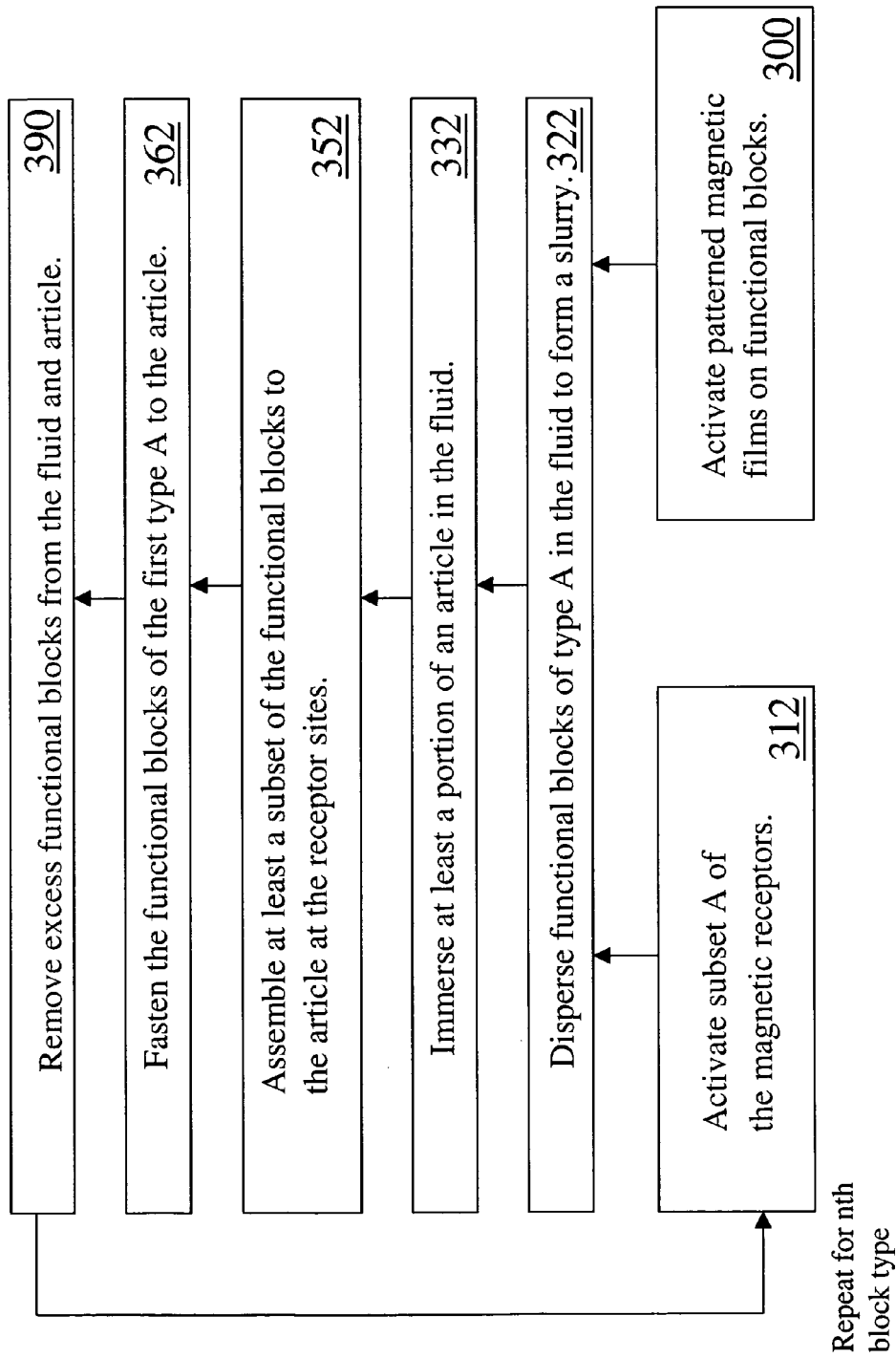
FIG. 18 is a flow diagram illustrating another fluidic assembly embodiment of the invention.

A process diagram for a single fluid embodiment is shown in FIG. 18. As indicated in FIG. 18, the fluidic assembly method includes at step 390 removing the excess functional blocks 10 from the fluid 66 and article 20 after the assembling sub-step 352. For this embodiment, repetition of the dispersing step 322 comprises dispersing the functional blocks 10 of the nth type in the fluid 66 to form an nth slurry 68. Similarly, repetition of the immersing step at sub-step 332 comprises immersing the article 20 in the fluid 66, and repetition of the assembling step 352 comprises assembling the functional blocks 10 of the nth type to an nth subset of the magnetic receptors 76 on the article 20.

Figure 15:
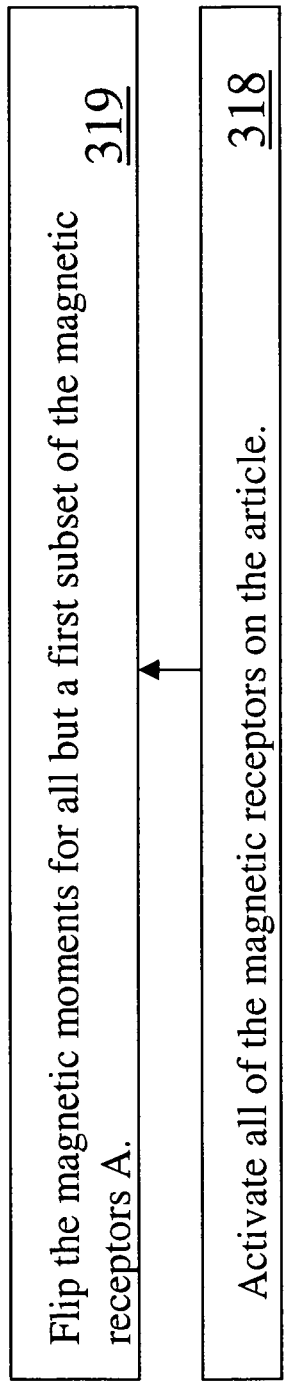
FIG. 15 illustrates another exemplary technique for activating a subset of magnetic receptors.

As noted above, the activating sub-step 312 can be accomplished in several ways. For the exemplary embodiment discussed above with reference to FIG. 12, none of the magnetic receptors 76 is magnetized in an initial state. At sub-step 312 a subset of the receptors 76 is then activated. In another embodiment, described below with reference to FIGS. 10 and 15, a "bit-flipping" technique is employed to activate a selected subset A of the receptors. For the exemplary heterogeneous, fluid assembly method illustrated by FIG. 15, the magnetic receptors 76 comprise patterned magnetic films 76 comprising at least one material with a perpendicular magnetic anisotropy. As indicated in FIG. 12, the dispersing step 320 comprises at step 322, dispersing a number of functional blocks 10 of a first type A in the fluid 66 to form the slurry 68. As indicated in FIG. 15, the activating step 310 includes at sub-step 318, activating all of the magnetic receptors 76 on the article 20, such that each of the magnetic receptors 76 has a magnetic moment, and at sub-step 319, flipping the magnetic moments for all but a first subset of the magnetic receptors A. As indicated in FIG. 10, for example, the assembling step 352 comprises assembling the functional blocks 10 of the first type A to respective ones of the first subset of magnetic receptors 76, and the fluidic assembly method further includes repeating the activating step 310, dispersing step 322, immersing step 330 and assembling step 352 for at least a number of functional blocks 10 of an nth type and a corresponding nth subsets of the magnetic receptors 76, wherein n is an integer and n≧2. The bit-flipping technique discussed above encompasses both: (1) first orienting all of the receptors in a binding configuration and flipping the magnetic moments for all but the subset A of receptors 76, such that only subset A receptors remain in a binding configuration as well as (b) first orienting all of the receptors in an anti-binding configuration and then flipping the magnetic moments for the subset A of receptors 76 to be in a binding configuration.

Figure 13:
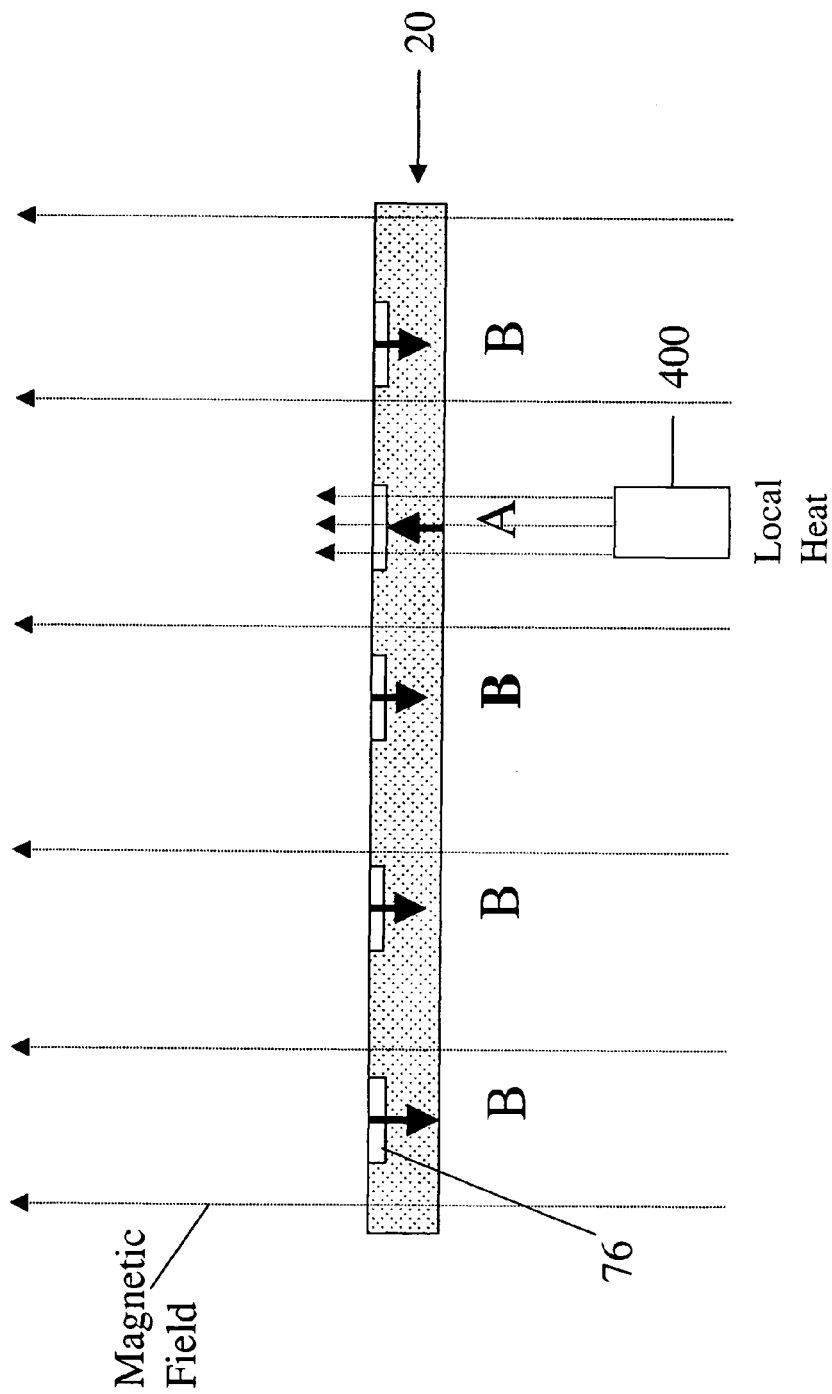
FIG. 13 illustrates a bit-flipping embodiment using local heat sources.
Figure 14:
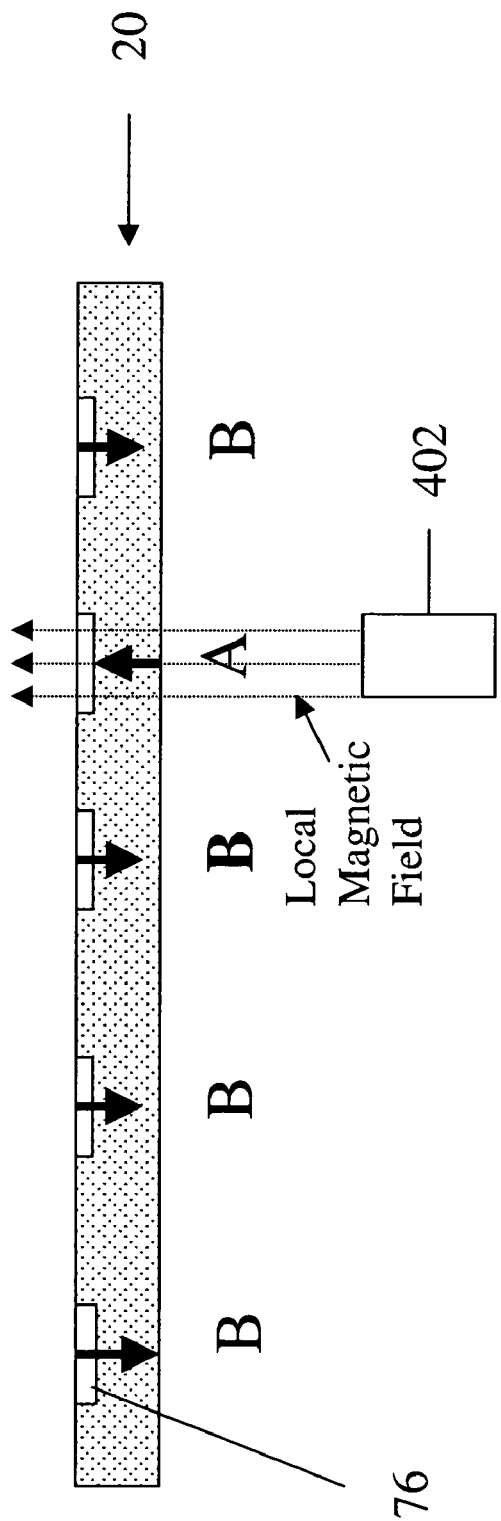
FIG. 14 illustrates a bit-flipping embodiment using local magnetic fields.

FIGS. 13 and 14 illustrate exemplary techniques for activating the receptors 76. For these embodiments, all of the magnetic receptors 76 are activated at sub-step 318, by applying a global magnetic field having a first orientation to the article 20, in order to orient the magnetic moments for all of the receptors in an anti-binding configuration (spin down in FIG. 13). The global magnetic field is then removed. For the exemplary embodiment shown in FIG. 13, the magnetic moments are flipped at sub-step 319, by thermally activating all but the respective subset A of the magnetic receptors 76 and then applying a magnetic field having an opposite orientation to the article 20, in order to orient the magnetic moments for subset A in a binding configuration (spin up in FIG. 13). In this embodiment, the magnitude of the global magnetic field is chosen to be above the coercive field for the unheated magnetic regions 76 and below the coercivity of the heated magnetic regions 76. In another embodiment, a global magnetic field is first applied at sub-step 318, to initially orient the magnetic moments of all of receptors 76 in a binding configuration. Then, local magnetic fields are applied at sub-step 319 above the coercive field of magnetic regions 76, to all but the respective subset A of the receptors, so that only the subset A of receptors remains in a binding configuration. For the exemplary embodiment of FIG. 14, a global field is first applied to orient the magnetic moments of all of the receptors in an anti-binding configuration (spin down in FIG. 14) at sub-step 318 and then the magnetic moments are flipped at sub-step 319 by applying local magnetic fields to the receptors 76 within subset A.

Another method embodiment of the invention is described with reference to FIG. 19. As shown for example in FIG. 19, a method of manufacturing an assembly 30 includes at step 410, disposing a number of functional blocks 10 over at least a portion of article 20. The method further includes at step 420, agitating the functional blocks 10 relative to the article 20 and at step 430 assembling at least a subset (A, B) of the functional blocks 10 to the magnetic receptors 76 on the article 20. Agitation of the functional blocks 10 relative to the article 20 can be achieved, for example, by moving the blocks 10 relative to the article 20 or by moving the article 20 relative to the blocks 10. According to a particular embodiment, the agitating step 420 comprises at least one of thermal agitation (for example, Brownian motion), mechanical agitation (for example, vibration) and combinations thereof. In another embodiment, the agitating step 420 comprises placing the article 20 in a slurry 68 at different angles with respect to the gravitational direction to cause the functional blocks to translate back on forth across the face of the article 20 until the functional blocks 12 attach to receptor sites 74. One example (not expressly shown) of this latter embodiment includes rocking the article 20 in the slurry 68.

Figure 19:
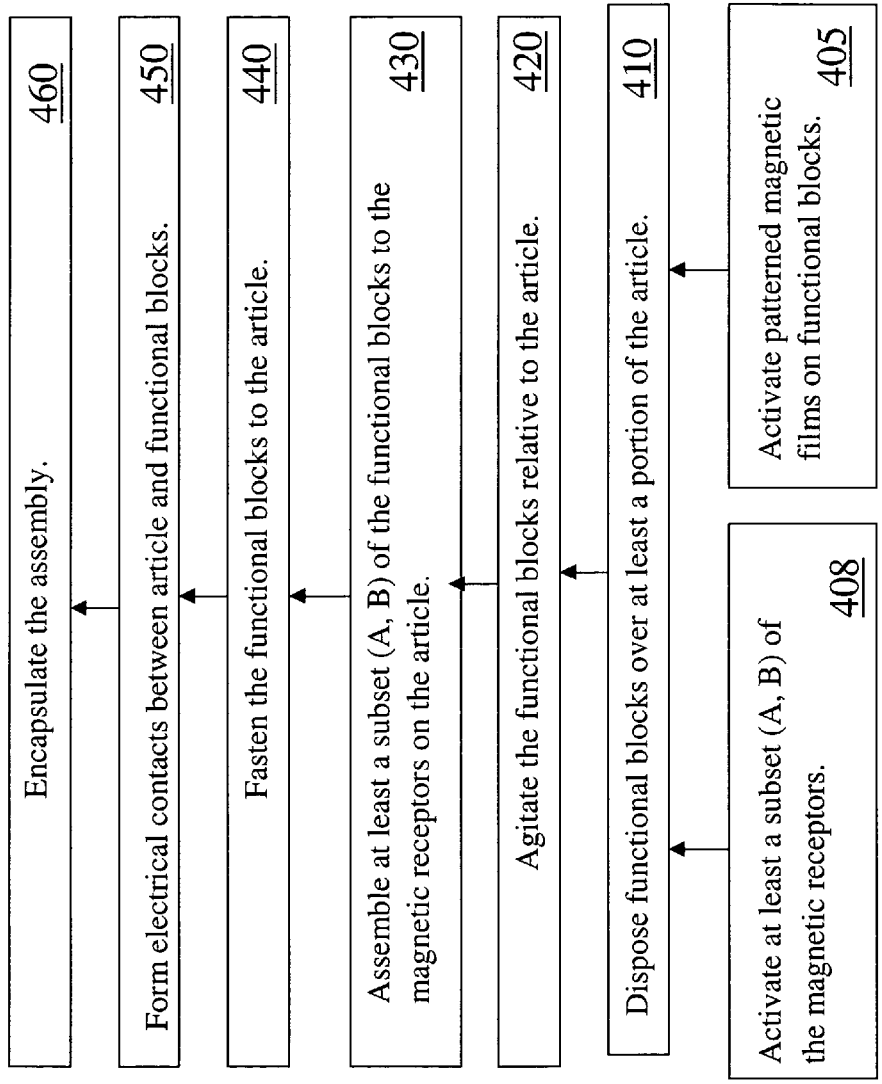
FIG. 19 is a flow diagram illustrating another method embodiment of the invention.

For the exemplary embodiment illustrated by FIG. 19, the method further includes at step 405 activating the patterned magnetic films 14 to exhibit respective magnetic moments μ that are oriented in a range of plus or minus forty-five degrees from the surface normal 19 for the respective connecting surface 17, and more particularly, to exhibit respective magnetic moments μ that are oriented in a range of plus or minus ten degrees from the surface normal 19 for the respective connecting surface 17. As indicated, the activating step 405 is performed prior to the disposing step 410. According to a particular embodiment, the patterned magnetic films 14 comprise a material with a perpendicular magnetic anisotropy, and the method further includes at step 405 activating the patterned magnetic films 14 prior to performing the disposing step 410.

For the exemplary embodiment illustrated by FIG. 19, the method further includes at step 408, activating at least a subset A, B of the magnetic receptors 76 to generate respective magnetic field gradients for attracting respective ones of the patterned magnetic films 14. As indicated, the activating step 408 is performed prior to the disposing step 410. According to a particular embodiment, the magnetic receptors 76 comprise patterned magnetic films 76 comprising at least one material with a perpendicular magnetic anisotropy. According to a particular embodiment, the activating step 408 comprises activating all of the magnetic receptors 76 on the substrate 72.

For the exemplary embodiment illustrated by FIG. 19, the method further optionally includes at step 440 fastening the functional blocks 10 to the article 20 after the assembling step 430. Further, the method further optionally includes at step 450 forming electrical contacts 24, 84 between the article 20 and the functional blocks 10 and at step 460, encapsulating the assembly 30, as discussed above.

Figure 20:
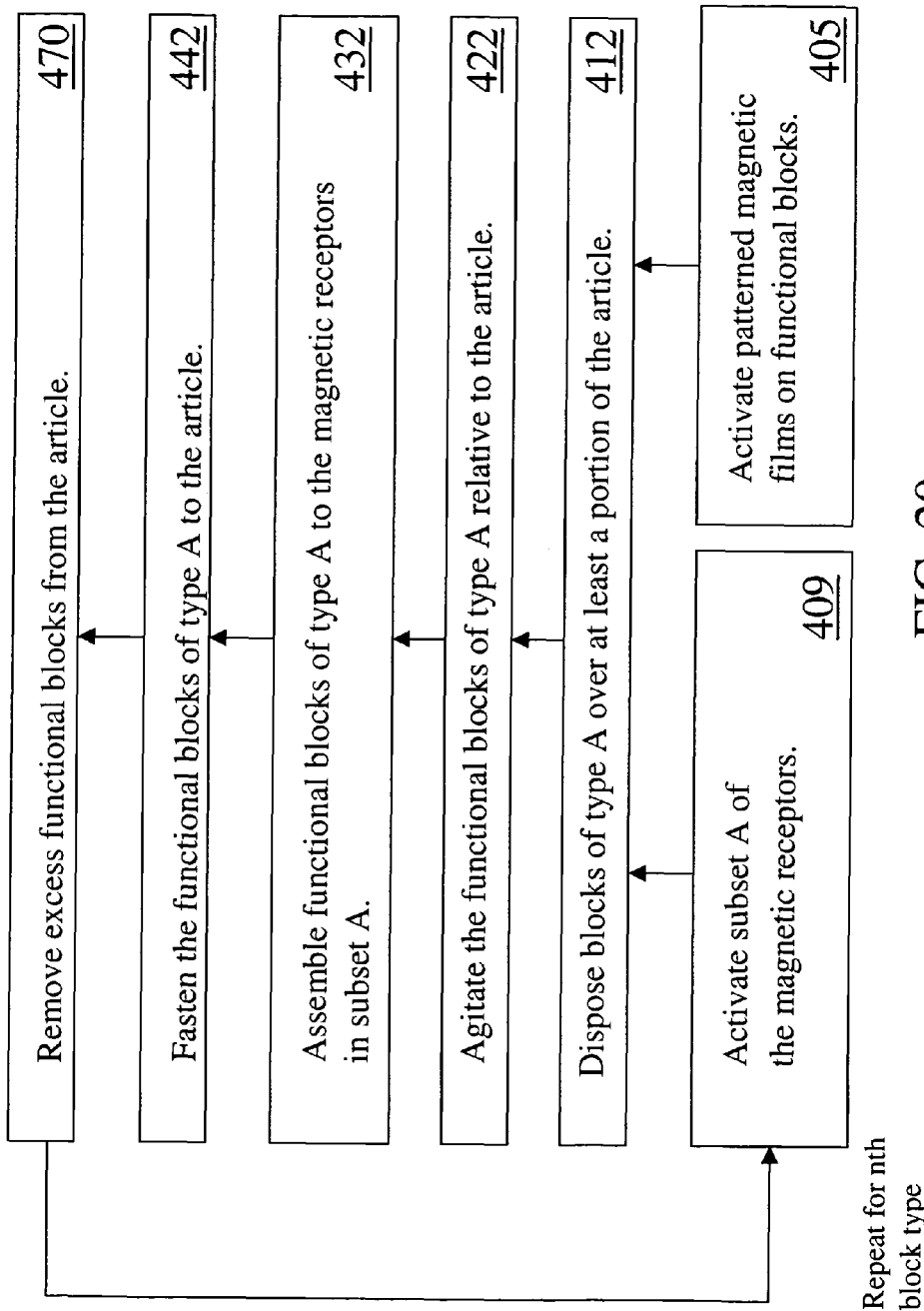
FIG. 20 illustrates a heterogeneous, fluidic assembly method embodiment of the invention.

FIG. 20 illustrates a heterogeneous embodiment of the method of FIG. 19. As shown for example in FIG. 20, the disposing step 410 includes at sub-step 412 disposing a number of functional blocks 10 of a first type A over at least a portion of the article 20. For this heterogeneous embodiment, the activating step 408 includes at sub-step 409 activating a first subset of the magnetic receptors (A), the assembling step 430 comprises at sub-step 432 assembling the functional blocks 10 of the first type A to respective ones of the first subset A of magnetic receptors 76. For the exemplary heterogeneous embodiment illustrated in FIG. 20, the method further includes repeating the activating step 409, disposing step 412, agitating step 420 and assembling step 432 for at least a number of functional blocks 10 of an nth type and a corresponding nth subset(s) of the magnetic receptors, wherein n is an integer and n≧2. The method optionally includes at substep 442 fastening the functional blocks 10 of the first type A to the article 20 after the assembling sub-step 432 for the functional blocks 10 of the first type A, and repeating the fastening step 432 for the functional blocks 10 of the nth type.

As indicated, for example, in FIG. 20, the method further includes at step 470 removing excess functional blocks 10 from the article 20 after the assembling step 430. For the illustrated embodiment, repetition of the disposing step 412 comprises disposing the functional blocks 10 of the nth type over at least a portion of the article 20, repetition of the agitating step 422 comprises agitating the functional blocks 10 of the nth type relative to the article 20, and repetition of the assembling step 432 comprises assembling the functional blocks 10 of the nth type to an nth subset of the magnetic receptors 76 on the article 20.

The method embodiment described above with respect to FIG. 19 can incorporate the bit-flipping technique discussed above with reference to FIGS. 12-14. A heterogeneous, fluidic assembly method is described with reference to FIGS. 16 and 17. As indicated for example in FIG. 17, the method includes at step 322 dispersing a number of functional blocks 10 of a first type A in a first fluid 66a to form a first slurry 68a and at step 322 dispersing a number of functional blocks 10 of a second type B in a second fluid 66b to form a second slurry 68b. The method further includes at step 332 immersing an article 20 in the first fluid 66a and at step 332 immersing the article 20 in the second fluid 66b. The exemplary method further includes at step 385 advancing the article 20 through the first and second fluids. The method can be used for the heterogeneous assembly of a number of block types. Accordingly, for a particular embodiment, the method further includes at step 322 dispersing a number of functional blocks 10 of an nth type in an nth fluid 66n to form an nth slurry 68n, where n is an integer and n≧3 and at step 332 immersing the article 20 in the nth fluid. At step 385 the article 20 is optionally advanced through the first through nth fluids. According to a particular embodiment, the advancing step 385 is performed using a roll-to-roll process.

Although only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A fluidic assembly method comprising:
dispersing a plurality of functional blocks in a fluid to form a slurry, each of the functional blocks comprising at least one element and a patterned magnetic film comprising at least one region; and
immersing at least a portion of an article in the fluid, the article comprising a substrate, a plurality of receptor sites disposed on the substrate and a plurality of magnetic receptors, each of the magnetic receptors being disposed within a respective one of the receptor sites, wherein each of the elements has a connecting surface, the fluidic assembly method further comprising activating the patterned magnetic films to exhibit respective magnetic moments (μ) that are oriented in a range of plus or minus forty-five degrees from the surface normal for the respective connecting surface, wherein the activating step is performed prior to the dispersing step.

2. The fluidic assembly method of claim 1, further comprising flowing the fluid over the article in order to flow the slurry over the article.

3. The fluidic assembly method of claim 2, wherein the flowing step comprises achieving a laminar flow of the fluid over the article.

4. The fluidic assembly method of claim 2, wherein the fluid comprises an incompressible fluid.

5. The fluidic assembly method of claim 2, wherein the fluid comprises a compressible fluid.

6. The fluidic assembly method of claim 1, wherein the patterned magnetic films comprise a material with a perpendicular magnetic anisotropy.

7. A fluidic assembly method comprising:
dispersing a plurality of functional blocks in a fluid to form a slurry, each of the functional blocks comprising at least one element and a patterned magnetic film comprising at least one region;
immersing at least a portion of an article in the fluid, the article comprising a substrate, a plurality of receptor sites disposed on the substrate and a plurality of magnetic receptors, each of the magnetic receptors being disposed within a respective one of the receptor sites; and
activating at least a subset of the magnetic receptors to generate respective magnetic field gradients for attracting respective ones of the patterned magnetic films.

8. The fluidic assembly method of claim 7, wherein the magnetic receptors comprise patterned magnetic films comprising at least one material with a perpendicular magnetic anisotropy.

9. The fluidic assembly method of claim 8, wherein the activating step is performed prior to the immersing step.

10. The fluidic assembly method of claim 7, further comprising:
activating the patterned magnetic films on the functional blocks prior to performing the dispersing step; and
assembling at least a subset of the functional blocks to the article at the receptor sites using the magnetic field gradients generated by the magnetic receptors.

11. The fluidic assembly method of claim 10, further comprising fastening the functional blocks to the article after the assembling step.

12. The fluidic assembly method of claim 11, wherein the fastening step is performed using a plurality of contacts.

13. The fluidic assembly method of claim 11, wherein the fastening step is performed using an activated adhesive.

14. The fluidic assembly method of claim 10, further comprising forming a plurality of electrical contacts between the article and the functional blocks.

15. The fluidic assembly method of claim 10, wherein the assembling step forms an assembly, the fluidic assembly method further comprising encapsulating the assembly.

16. The fluidic assembly method of claim 10, wherein the activating the magnetic receptors step comprises activating all of the magnetic receptors on the substrate.

17. The fluidic assembly method of claim 10, wherein the dispersing step comprises dispersing a plurality of functional blocks of a first type in the fluid to form the slurry,
wherein the activating the magnetic receptors step comprises activating a first subset of the magnetic receptors,
wherein the assembling step comprises assembling the functional blocks of the first type to respective ones of the first subset of magnetic receptors, and
wherein repeating the immersing step comprises immersing the article in the nth fluid, and
wherein repeating the assembling step comprises assembling the functional blocks of the nth type to an nth subset of the magnetic receptors on the article.

18. The fluidic assembly method of claim 17, wherein the activating the magnetic receptors step comprises activating a plurality of coils.

19. The fluidic assembly method of claim 17, wherein the activating the magnetic receptors step comprises locally heating the respective subset of the magnetic receptors and applying a global magnetic field to the article.

20. The fluidic assembly method of claim 17, wherein the activating the magnetic receptors step comprises applying local magnetic fields to the respective subset of the magnetic receptors.

21. The fluidic assembly method of claim 17, wherein the type of functional block is characterized by at least one of: (a) a type of element incorporated in the functional block, (b) a number of elements incorporated in the functional block and combinations thereof.

22. The fluidic assembly method of claim 17, further comprising fastening the functional blocks of the first type to the article after the assembling step for the functional blocks of the first type, wherein the fluidic assembly method further comprises repeating the fastening step for the functional blocks of the nth type.

23. The fluidic assembly method of claim 17, wherein repeating the dispersing step comprises dispersing the functional blocks of the nth type in an nth fluid to form an nth slurry,
activating all of the magnetic receptors on the article, such that each of the magnetic receptors has a magnetic moment, and
flipping the magnetic moments for all but a first subset of the magnetic receptors (A),
wherein the assembling step comprises assembling the functional blocks of the first type to respective ones of the first subset of magnetic receptors, and
wherein the fluidic assembly method further comprises repeating the activating the magnetic receptors, dispersing, immersing and assembling steps for at least a plurality of functional blocks of an nth type and a corresponding nth subset(s) of the magnetic receptors, wherein n is an integer and $n \geq 2$.

24. The fluidic assembly method of claim 23, further comprising advancing the article through the first through nth fluids.

25. The fluidic assembly method of claim 24, wherein the advancing step is performed using a roll-to-roll process.

26. The fluidic assembly method of claim 17, further comprising removing a plurality of excess functional blocks from the fluid and article after the assembling step,
wherein repeating the dispersing step comprises dispersing the functional blocks of the nth type in the fluid to form an nth slurry,
wherein repeating the immersing step comprises immersing the article in the fluid, and
wherein repeating the assembling step comprises assembling the functional blocks of the nth type to an nth subset of the magnetic receptors on the article.

27. The fluidic assembly method of claim 10, wherein the magnetic receptors comprise patterned magnetic films comprising at least one material with a perpendicular magnetic anisotropy,
wherein the dispersing step comprises dispersing a plurality of functional blocks of a first type in the fluid to form the slurry,
wherein the activating the magnetic receptors step comprises:
wherein the fluidic assembly method further comprises repeating the activating the magnetic receptors, dispersing, immersing and assembling steps for at least a plurality of functional blocks of an nth type and a corresponding nth subset(s) of the magnetic receptors, wherein n is an integer and $n \geq 2$.

28. The fluidic assembly method of claim 27, wherein the activating all of the magnetic receptors step is performed by applying a global magnetic field to the article.

29. The fluidic assembly method of claim 28, wherein the flipping the magnetic moments step is performed by thermally activating all but the respective subset of the magnetic receptors and then applying a magnetic field to the article.

30. The fluidic assembly method of claim 28, wherein the flipping the magnetic moments step comprises applying local magnetic fields to all but the respective subset of the magnetic receptors.

31. A method of manufacturing an assembly, the method comprising:
disposing a plurality of functional blocks over at least a portion of an article comprising a substrate, a plurality of receptor sites disposed on the substrate and a plurality of magnetic receptors, each of the receptors being disposed within a respective one of the receptor sites, wherein each of the functional blocks comprises at least one element and a patterned magnetic film comprising at least one region;
agitating the functional blocks relative to the article; and
assembling at least a subset of the functional blocks to the magnetic receptors on the article,
wherein the patterned magnetic films comprise a material with a perpendicular magnetic anisotropy, the method further comprising activating the patterned magnetic films prior to performing the disposing step.

32. The method of claim 31, wherein the agitating step comprises at least one of thermal agitation, mechanical agitation and combinations thereof.

33. A method of manufacturing an assembly, the method comprising:
disposing a plurality of functional blocks over at least a portion of an article comprising a substrate, a plurality of receptor sites disposed on the substrate and a plurality of magnetic receptors, each of the receptors being disposed within a respective one of the receptor sites, wherein each of the functional blocks comprises at least one element and a patterned magnetic film comprising at least one region;
agitating the functional blocks relative to the article; and
assembling at least a subset of the functional blocks to the magnetic receptors on the article,
wherein each of the elements has a connecting surface, the method further comprising activating the patterned magnetic films to exhibit respective magnetic moments ($\mu$) that are oriented in a range of plus or minus ten degrees from the surface normal for the respective connecting surface, wherein the activating step is performed prior to the disposing step.

34. A method of manufacturing an assembly, the method comprising:
disposing a plurality of functional blocks over at least a portion of an article comprising a substrate, a plurality of receptor sites disposed on the substrate and a plurality of magnetic receptors, each of the receptors being disposed within a respective one of the receptor sites, wherein each of the functional blocks comprises at least one element and a patterned magnetic film comprising at least one region;
agitating the functional blocks relative to the article;
assembling at least a subset of the functional blocks to the magnetic receptors on the article; and activating at least a subset of the magnetic receptors to generate respective magnetic field gradients for attracting respective ones of the patterned magnetic films, wherein the activating the magnetic receptors step is performed prior to the disposing step.

35. The method of claim 34, wherein the magnetic receptors comprise patterned magnetic films comprising at least one material with a perpendicular magnetic anisotropy.

36. The method of claim 34, further comprising activating the patterned magnetic films on the functional blocks prior to performing the disposing step, wherein the assembling step is performed using the magnetic field gradients generated by the magnetic receptors.

37. The method of claim 36, further comprising fastening the functional blocks to the article after the assembling step.

38. The fluidic assembly method of claim 36, further comprising forming a plurality of electrical contacts between the article and the functional blocks.

39. The method of claim 36, further comprising encapsulating the assembly.

40. The method of claim 36, wherein the activating the magnetic receptors step comprises activating all of the magnetic receptors on the substrate.

41. The method of claim 36, wherein the disposing step comprises: disposing a plurality of functional blocks of a first type over at least a portion of the article,
wherein the activating the magnetic receptors step comprises activating a first subset of the magnetic receptors,
wherein the assembling step comprises assembling the functional blocks of the first type to respective ones of the first subset of magnetic receptors, and
wherein the method further comprises repeating the activating the magnetic receptors, disposing, agitating and assembling steps for at least a plurality of functional blocks of an nth type and a corresponding nth subset(s) of the magnetic receptors, wherein n is an integer and n≧2.

42. The method of claim 41, wherein the type of functional block is characterized by at least one of: (a) a type of element incorporated in the functional block, (b) a number of elements incorporated in the functional block and combinations thereof.

43. The method of claim 41, further comprising fastening the functional blocks of the first type to the article after the assembling step for the functional blocks of the first type, wherein the method further comprises repeating the fastening step for the functional blocks of the nth type.

44. The method of claim 41, further comprising removing a plurality of excess functional blocks from the article after the assembling step,
wherein repeating the disposing step comprises disposing the functional blocks of the nth type over at least a portion of the article,
wherein repeating the agitating step comprises agitating the functional blocks of the nth type relative to the article, and
wherein repeating the assembling step comprises assembling the functional blocks of the nth type to an nth subset of the magnetic receptors on the article.

45. The method of claim 36, wherein the magnetic receptors comprise patterned magnetic films comprising at least one material with a perpendicular magnetic anisotropy,
wherein the disposing step comprises disposing a plurality of functional blocks of a first type over at least a portion of the article,
wherein the activating the magnetic receptors step comprises:
   activating all of the magnetic receptors on the article, such that each of the magnetic receptors has a magnetic moment, and
   flipping the magnetic moments for all but a first subset of the magnetic receptors (A),
wherein the assembling step comprises assembling the functional blocks of the first type to respective ones of the first subset of magnetic receptors, and
wherein the method further comprises repeating the activating the magnetic receptors, disposing, agitating and assembling steps for at least a plurality of functional blocks of an nth type and a corresponding nth subset(s) of the magnetic receptors, wherein n is an integer and n≧2.

* * * * *

UNITED STATES PATENT AND TRADEMARK OFFICE
CERTIFICATE OF CORRECTION

PATENT NO.        : 7,926,176 B2
APPLICATION NO.   : 11/254181
DATED             : April 19, 2011
INVENTOR(S)       : Huber et al.

Page 1 of 1

It is certified that error appears in the above-identified patent and that said Letters Patent is hereby corrected as shown below:

In Column 14, Lines 63-67, in Claim 17, delete "wherein repeating the................receptors on the article." and insert -- wherein the fluidic assembly method further comprises repeating the activating the magnetic receptors, dispersing, immersing and assembling steps for at least a plurality of functional blocks of an nth type and a corresponding nth subset(s) of the magnetic receptors, wherein n is an integer and n>2. --, therefor.

In Column 15, Lines 27-40, in Claim 23, delete "activating all of the magnetic................and n≥2." and insert -- wherein repeating the immersing step comprises immersing the article in the nth fluid, and wherein repeating the assembling step comprises assembling the functional blocks of the nth type to an nth subset of the magnetic receptors on the article. --, therefor.

In Column 15, Lines 65-67, in Claim 27, delete "wherein the fluidic.........at least a plurality of" and insert -- activating all of the magnetic receptors on the article, such that each of the magnetic receptors has a magnetic moment, and flipping the magnetic moments for all but a first subset of the magnetic receptors (A), wherein the assembling step comprises assembling the functional blocks of the first type to respective ones of the first subset of magnetic receptors, and wherein the fluidic assembly method further comprises repeating the activating the magnetic receptors, dispersing, immersing and assembling steps for at least a plurality of --, therefor.

Signed and Sealed this
Twenty-fourth Day of January, 2012

David J. Kappos
*Director of the United States Patent and Trademark Office*